(12) United States Patent
Sato et al.

(10) Patent No.: US 7,199,985 B1
(45) Date of Patent: Apr. 3, 2007

(54) MAGNETIC SENSOR, MAGNETIC HEAD, MAGNETIC ENCODER AND HARD DISK DEVICE

(75) Inventors: Masashige Sato, Kawasaki (JP);
Hideyuki Kikuchi, Kawasaki (JP);
Kazuo Kobayashi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 239 days.

(21) Appl. No.: 09/581,468

(22) Filed: Jun. 12, 2000

Related U.S. Application Data

(63) Continuation of application No. PCT/JP99/05568, filed on Oct. 8, 1999.

(30) Foreign Application Priority Data

Oct. 12, 1998 (JP) ............................. 10-289781
Oct. 29, 1998 (JP) ............................. 10-308989

(51) Int. Cl.
*G11B 5/33* (2006.01)

(52) U.S. Cl. .................................... 360/324.2

(58) Field of Classification Search ............. 360/324.2, 360/324, 324.1, 324.11, 324.12
See application file for complete search history.

(56) References Cited

U.S. PATENT DOCUMENTS

| | | | |
|---|---|---|---|
| 5,206,590 A | | 4/1993 | Dieny et al. |
| 5,325,056 A | | 6/1994 | Shonowaki et al. |
| 5,650,958 A | | 7/1997 | Gallagher et al. |
| 5,729,410 A | | 3/1998 | Fontana, Jr. et al. |
| 5,862,022 A | * | 1/1999 | Noguchi et al. ......... 257/421 |
| 5,898,547 A | * | 4/1999 | Fontana et al. ......... 360/324.2 |
| 6,108,177 A | * | 8/2000 | Gill ...................... 360/324.12 |

FOREIGN PATENT DOCUMENTS

| | | |
|---|---|---|
| EP | 791916 | 8/1997 |
| EP | 831541 | 3/1998 |
| EP | 872828 | 10/1998 |
| JP | 59-195312 | 11/1984 |
| JP | 63-229609 | 9/1988 |
| JP | 5-250631 | 9/1993 |
| JP | 7-73419 | 3/1995 |
| JP | 07073419 A | 3/1995 |
| JP | 8-21166 | 3/1996 |
| JP | 08185612 A | 7/1996 |
| JP | 9-106514 | 4/1997 |
| JP | 9-245318 | 9/1997 |
| JP | 09245318 A | 9/1997 |
| JP | 9-251618 | 9/1997 |
| JP | 9-282616 | 10/1997 |
| JP | 09288807 A | 11/1997 |
| JP | 10-4227 | 1/1998 |
| JP | 10-69609 | 3/1998 |
| WO | 0 831 541 A2 | 3/1998 |

\* cited by examiner

*Primary Examiner*—Mark Blouin
*Assistant Examiner*—A. J. Heinz
(74) *Attorney, Agent, or Firm*—Greer, Burns & Crain, Ltd.

(57) ABSTRACT

A magnetic sensor including a ferromagnetic tunnel junction, comprises a free layer 10 a magnetic direction of which freely rotates, and a barrier layer 11 formed on the free layer and reduces a thickness in a first region, the free layer in a region corresponding to the first region functioning as a sensor portion for sensing an external magnetic field. Such magnetic sensor can provide magnetic sensors, magnetic heads and magnetic encoders having high sensitivity. Furthermore, such magnetic sensor can provide magnetic heads which are adaptable to high recording density of magnetic storage mediums, and hard disk devices of large storage capacities using the magnetic heads.

19 Claims, 25 Drawing Sheets

N POLE
S POLE
56

MAGNETIC SENSOR, MAGNETIC HEAD, MAGNETIC ENCODER AND HARD DISK DEVICE

CROSS REFERENCE TO RELATED APPLICATION

This application is a Continuation of PCT application No. PCT/JP99/05568, which was filed on Oct. 8, 1999, and which designated the United States.

TECHNICAL FIELD

The present invention relates to a magnetic sensor, a magnetic head, a magnetic encoder and a hard disk device, more specifically, a magnetic sensor, a magnetic head, a magnetic encoder and a hard disk device which utilize a ferromagnetic tunnel junction.

BACKGROUND ART

Some electronic devices utilize tunnel phenomenon. The tunnel phenomenon generally means a phenomenon that particles, e.g., electrons, etc., having lower kinetic energy than a potential barrier can pass the potential barrier to transit. The tunnel phenomenon is a phenomenon which cannot be explained by classical mechanics, but is characteristics of quantum mechanics and can be explained by quantum mechanics. A wave function of a particle propagates inside the potential barrier toward outside the potential barrier, attenuating, and unless an amplitude of the wave function is zero outside the potential barrier, the wave function propagates as a progressive wave, and can exit the potential barrier.

As examples of the tunnel phenomenon are known the phenomenon that α-particle is emitted from an atomic nucleus by α-decay, the phenomenon that electrons are emitted from the surface of a metal when a high voltage is applied to the metal (field emission), the phenomenon that when a high reverse bias is applied to a pn junction of a semiconductor, electrons punch through a depletion layer, and other phenomena. The tunnel phenomenon is practically a very important quantum mechanic effect.

A typical phenomenon as the tunnel phenomenon used in electronic devices is that when a voltage is applied to the metals on both sides of a "metal/insulator/metal" junction, a little current flows when the insulation is sufficiently thin. This phenomenon is one that takes place because an electron has a low probability of passing through an insulator, which usually does not conduct current, owing to the quantum mechanic effect when the insulator has a thickness of some angstroms (Å) to tens Å and is as thin as preferably some Å to ten-order Å. The current is called "tunnel current", and a junction of such structure is called a "tunnel junction".

In order to realize a very thin insulation layer for realizing the tunnel junction, usually an oxide film of a metal layer is used as an insulator barrier. For example, such insulator barrier is formed by oxidizing a surface layer of aluminum by suitable oxidation, such as natural oxidation, plasma oxidation, thermal oxidation or others. A film thickness of an oxide film can be controlled by adjusting oxidation conditions in accordance with used oxidation, and can have a required thickness of some angstroms (Å) to tens Å. The thus-formed aluminum oxide is a very thin insulator and can function as a barrier layer of a tunnel junction.

When a voltage is applied between the metals of the tunnel junction of the above-described "metal/oxide film/metal", which are on both sides thereof, the current corresponding to the applied voltage characteristically exhibits non-linearity, which is different from linearity exhibited by the usual resistor. Electronic devices having such tunnel junction are used as non-linear devices.

Then, the structure "ferromagnetic metal/oxide film/ferromagnetic metal", which has the metals of the "metal/oxide film/metal" on both sides replaced by the ferromagnetic metals is called "ferromagnetic tunnel junction". It is known that in the ferromagnetic tunnel junction a tunnel probability (tunnel resistance) depends on a magnetized state of the magnetic layers on both sides. In other words, it is possible to control the tunnel resistance by changing a magnetized state of the magnetic layers on both sides by a magnetic field. When a relative angle between magnetic directions of both magnetic layers is represented by θ, a tunnel resistance R is expressed by $$R = R_s + 0.5 \times \Delta R (1 - \cos \theta) \qquad (1)$$

$R_s$ represents a tunnel resistance at the time that a saturated magnetic field is applied. Two magnetic directions on both sides are oriented in directions of the magnetic field application. ΔR represents a change of the tunnel resistance.

What Formula (1) means is that when the two magnetic layers are magnetized in the same direction in a saturated magnetic filed, a relative angle θ=0° (cos θ=1), and a tunnel resistance R=$R_s$. In contrast to this, when the two magnetic layers are magnetized in direction opposite to each other in a saturated magnetic field, a relative angle in the magnetic directions θ=180° (cos θ=−1), and a tunnel resistance R=$R_s$+ΔR. In the absence of a magnetic field, as will be described later, one of the two magnetic layers has a magnetic direction fixed as the magnetic layer on the fixed side, and the other magnetic layer has a magnetic field direction weakly controlled in a domain as the magnetic layer on the free side so that the magnetic filed direction is orthogonal to a magnetic direction of the fixed side-magnetic layer. At this time, a relative angle between the magnetic direction of the two magnetic layers is θ=90° (cos θ=0), and a tunnel resistance R=$R_s$+0.5×ΔR.

That is, when magnetic directions of both magnetic layers agree with each other (θ=0°), a tunnel resistance R=$R_s$, which is minimum. When magnetic directions of both magnetic layers are opposite to each other (θ=180°), a tunnel resistance $R_o$=$R_s$+ΔR, which is maximum. Accordingly, magnetic directions of both magnetic layers are set in the absence of a magnetic field to be θ=90°, whereby a resistance value changes linearly, centering on a resistance value given when θ=90°, and linear outputs can be obtained.

Such phenomenon is attributable to that electrons in the ferromagnetic bodies are polarized. Usually electrons in a substance are up electrons, whose spin state is upward, and down electrons, whose spin state is downward. The non-magnetic metal has equal numbers of up electrons and down electrons, and does not exhibit magnetism as a whole non-magnetic metal. However, the magnetic metal has a number of up electrons ($N_{up}$) and a number of down electrons ($N_{down}$) which are different from each other, and exhibits as a whole magnetic metal magnetism (i.e., up magnetism or down magnetism) of the electrons whose number is larger.

It is known that electrons tunnel one of the magnetic layers on both sides to the other magnetic layer through the thin oxide film, these electrons tunnel with spin states of the respective electrons retained. Accordingly, when an electron state of the tunneled magnetic layer has voids, the tunneling is possible, but the tunneling is impossible when the electron state of the tunneled magnetic layer has no void.

As expressed below, a tunnel resistance change ratio ($\Delta R/R_s$) is expressed by using a product of a polarizability (also called deflected magnetic susceptibility) of a magnetic layer (to tunnel) as an electron source and a polarizability of a magnetic layer (to be tunneled).

$$\Delta R/R_s = 2 \times P_1 \times P_2/(1 - P_1 \times P_2) \qquad (2)$$

where $P_1$ represents a polarizability of one of the magnetic layers, and $P_2$ represents a polarizability of the other of the magnetic layers. A polarizability P of the magnetic layer is expressed as follows.

$$P = 2 \times (N_{up} - N_{down})/(N_{up} + N_{down}) \qquad (3)$$

where $N_{up}$ represents a number of up electron in the magnetic layer, and $N_{down}$ represents a number of down electrons in the magnetic layer.

A polarizability P of a magnetic layer depends on a kind of a ferromagnetic layer metal. However the magnetic layer often has a polarizability of approximately 50% depending on a kind, and in this case a tunnel resistance change ratio ($\Delta R/R_s$) of tens percent can be expected.

As the conventionally known magnetoresistance (MR) effect, a resistance change ratio is about 0.6% for anisotropic magnetoresistance (AMR) effect, and for giant, magnetoresistance (GMR) effect, a resistance change ratio is some percentage to ten-order percent. The tunnel resistance change ratio is remarkably higher in comparison with the changes of AMR and GMR, and can be expected to be applied to magnetic heads, magnetic sensors, etc.

As a typical application of GMR to a magnetic head, the spin valve structure is known. The applicant of the present application has already proposed a TMR (tunnel-MR) head having the above-described ferromagnetic tunnel junction applied to the spin valve structure.

The spin valve structure uses a structure in which a magnetic metal layer is disposed between two magnetic layers, and an antiferromagnetic layer covers the upper surface of one of one of the magnetic layers so as to fix a magnetic direction of said one of the magnetic layers. As a ferromagnetic tunnel junction, a thin oxide film is disposed between two ferromagnetic layers as described above.

FIG. 1A is a sectional view explaining the ferromagnetic tunnel structure. The spin valve structure having the ferromagnetic tunnel junction typically comprises, as exemplified in FIG. 1A, a lower electrode 2 formed on a silicon substrate 1, a free-side magnetic layer 3 formed on the lower electrode, a first magnetical metal layer 4 formed on the free-side magnetic layer, an insulation layer 5 formed on the first magnetic metal layer, a second magnetic metal layer 6 formed on the insulation layer, a fixed-side magnetic layer 7 formed on the second magnetic metal layer, an antiferromagnetic layer 8 formed on the fixed-side magnetic layer, and an upper electrode 9 formed on the antiferromagnetic layer 8.

The lower electrode 2, the free-side magnetic layer 3 and the first magnetic metal layer 4 form a lower layer 10, and the second magnetic metal layer 6, the fixed-side magnetic layer 7, the antiferromagnetic layer 8 and the upper electrode 9 form an upper layer 12. A barrier layer 11 of an insulation layer 5 is formed between the lower layer 10 and the upper layer 12, isolating both from each other.

Respective members of the spin valve structure are as exemplified below. The substrate 1 is formed of silicon. The lower electrode 2 and the upper electrode 9 are respectively formed of a Ta (tantalum) film and has an about 50 nm-thickness. The free-side magnetic layer 3 and the fixed-side magnetic layer 7 are respectively formed of an NiFe film and has an about 17 nm-thickness. The first and the second magnetic metal layers 4, 6 are formed respectively of a Co (cobalt) film and has an about 3.3 nm-thickness. The insulation layer 5 is formed of an Al—$Al_2O_3$ film and has an about 1.3 nm-thickness. The antiferromagnetic layer 8 is formed of an FeMn film and has an about 45 nm-thickness.

The former NiFe film is one of two ferromagnetic layers and is called the free-side magnetic layer (free layer) 3 because its magnetic direction is not fixed. An Al—AlO film sandwiched between both Co films 4, 6 provides the barrier layer 11 formed of a thin aluminum oxide film, which forms the ferromagnetic tunnel junction. The second NiFe film is the other ferromagnetic layer and is called the fixed-side magnetic layer (pinned layer) 7 because a magnetic direction is fixed. The first magnetic metal layer 4 makes the same function as the free-side magnetic layer 3, and the second magnetic metal layer 6 makes the same function as the fixed-side magnetic layer 7. The FeMn film exchange-couples with the fixed-side magnetic layer 7 to fix a magnetic direction of the fixed-side magnetic layer and is called an antiferromagnetic layer (pinning layer) 8.

In the structure of such "free-side magnetic layer/insulation layer/fixed-side magnetic layer/antiferromagnetic layer", when an external magnetic field (e.g., a signal magnetic field from a recording medium) is applied, magnetic directions of the free-side magnetic layer 3 and the first magnetic metal layer 4 alone are rotated. As a result, mainly a relative angle θ between a magnetic direction of the first magnetic metal layer 4 and that of the second magnetic metal layer 6 is changed, and a resistance change of the ferromagnetic tunnel junction is exhibited. That is, as shown by Formula (1), the tunnel resistance of the TMR (tunnel MR) changes depending on a magnetic field.

FIG. 1B is a schematic diagram explaining the measurement of resistance changes of a magnetic sensor using the ferromagnetic tunnel structure shown in FIG. 1A. A current source 39 is connected between the upper layer 12 and the lower layer 10, and certain current is charged. A voltage detector 40 is also connected between the upper layer 12 and the lower layer 10, and voltage changes between both layers are detected. When an external magnetic field (e.g., a signal magnetic field) is applied, a tunnel resistance of the ferromagnetic tunnel structure shown in FIG. 1A changes, and the tunnel resistance change is detected by the voltage detector 40 as a voltage change.

FIG. 2 shows a magnetoresistance effect curve of the tunnel structure using such spin valve structure. Based on FIG. 2, as an external magnetic field sequentially changes from −50 oersted (Oe) to −10 (Oe), to 0 (Oe), to +10 (Oe) and to +50 (Oe), reversible resistance change ratios of about 0.0% to about 0.0%, to about 10.0%, to about 20.0% and about 20.0% are exhibited. It has been found that the tunnel structure having the spin valve structure as shown in FIG. 2 exhibits substantially linear resistance change ratios of about 0% to 20% in an external magnetic field range of −10 (Oe) to +10 (Oe). Resistance change ratios of about 0% to 20% are exhibited in an external magnetic field range of −30 (Oe) to +30 (Oe). The resistance change ratios are converted to data of the logic [0], [1], whereby the resistance change ratios can be used in digital logic circuits.

However, in applying the tunnel structure having the spin valve structure to the magnetic sensor of a magnetic head, magnetic encoder or others, in a case that a device height h is too small, rotation of magnetic directions is often difficult near the edge of the device, which leads to a disadvantage that a sensitivity of the magnetic sensor is lowered.

In a case that practical device dimensions are in the order of some microns x some microns, when a device height h is decreased, static magnetic coupling of the fixed-side magnetic layer to the free-side magnetic layer becomes relatively stronger, and a magnetic direction of the free-side magnetic layer tends to be anti-parallel with a magnetic direction of the fixed-side magnetic layer, which makes it difficult for the magnetic direction to rotate in a direction of easy rotation. As a result, a sensitivity of the magnetoresistance effect device is lowered.

On the other hand, hard disk devices are prevalently used in electronic apparatuses because of their high speed of reading and writing data and large storage capacities.

The recent increase of storage capacities of the hard disk devices is remarkable, but further storage capacity increase is required.

To realize larger storage capacities of the hard disk devices it is an essential requirement that magnetic storage medium, i.e., magnetic disk mediums have higher recording densities. Recording density increase makes a recording bit of the magnetic recording medium smaller. It is necessary that the magnetic head is accordingly micronized, and the detection sensitivity is higher.

Recently, as a magnetic head of high detection sensitivity GMR (Giant Magneto-Resistance effect) head is proposed.

The GMR head is a magnetic head using the phenomenon that when an external magnetic field is applied to a layer film having a magnetic layer/a non-magnetic layer/a magnetic layer structure, an electric resistance of the layer film changes due to a difference between magnetized angles of the two magnetic layers, i.e., the GMR effect.

The GMR effect will be explained with reference to FIG. 3. FIG. 3 is a conceptual view of the GMR effect.

As shown in FIG. 3, the layer film 310 producing the GMR effect has the non-magnetic layer 316 sandwiched between the magnetic layer 314 and the magnetic layer 318. $\theta_1$ indicates a magnetized angle of the magnetic layer 314. $\theta_2$ indicates a magnetized angle of the magnetic layer 318. The magnetic layer 314 is magnetized at a magnetization vector $M_1$, and the magnetic layer 318 is magnetized at a magnetization vector $M_2$.

As shown in FIG. 3, a magnetic field is applied to the layer film 310 from the outside, a magnetized angle of the magnetic layer 314 becomes, e.g., $\theta_1$ and a magnetized angle of the magnetic layer 318 becomes, e.g., $\theta_2$.

When a difference between a magnetized angle $\theta_1$ and a magnetized angle $\theta_2$ is $\theta$, $$\theta=\theta_2-\theta_1$$

When an electric resistance at the time that no magnetic field is applied from the outside is $R_s$, an electric resistance R at the time that a magnetic field is applied from the outside is expressed by $$R=R_s+0.5\times\Delta R(1-\cos \Delta\theta)$$

where $\Delta R$ is a constant which is different for materials of the layer film 310.

A value represented by $$\Delta R/R_s\times 100(\%)$$

is called an MR ratio. When the magnetic layer 314 is formed of, e.g., Co layer, the non-magnetic layer 316 is formed of, e.g., Cu layer, and the magnetic layer 318 is formed of, e.g., Co layer, the MR ratio is about 5–10%.

In using the layer film producing such GMR effect to a magnetic head, generally a structure called a spin valve is used. The spin valve structure is published in the specification of Japanese Patent Laid-Open Publication No. 358310/1992.

The spin valve structure will be explained with reference to FIG. 4. FIG. 4 is a sectional view showing a layer film of the spin valve structure.

As shown in FIG. 4, the layer film 410 of the spin valve structure is formed of a magnetic layer 414, a non-magnetic layer 416 and a magnetic layer 418, and an antiferromagnetic layer 420.

In the layer film of the three-layer structure simply formed of the magnetic layer 414, the non-magnetic layer 416 and the magnetic layer 418, a magnetic direction of the magnetic layer 414 and that of the magnetic layer 418 substantially agree with each other due to an external magnetic field, and a magnetized angle difference between a magnetized angle of the magnetic layer 414 and that of the magnetic layer 418 is very small.

Then, the layer film 410 of the spin valve structure has the antiferromagnetic layer 420 formed on the magnetic layer 418. The antiferromagnetic layer 420 fixes only a magnetic direction of a magnetic direction of the magnetic layer 418 contacting the antiferromagnetic layer 420. A magnetic direction of the magnetic layer 414 alone freely rotate corresponding to an external magnetic field. The magnetic layer 418, whose magnetic direction is fixed, is called a fixed layer, and the magnetic layer 414, whose magnetic direction freely rotates, is called a free layer.

A magnetic direction of the magnetic layer 418 is fixed constant, and a magnetic direction of the magnetic layer 414 is freely rotated by an external magnetic field, whereby an electric resistance R of the layer film 410 is changed corresponding to an external magnetic field.

Next, an operational principle of the magnetic head using the spin valve structure will be explained with reference to FIG. 5. FIG. 5 is a perspective view of the magnetic head using the spin valve structure, which shows the operational principle thereof.

As shown in FIG. 5, the layer film 410 of the spin valve structure formed of the free layer 414, the non-magnetic layer 416, the field layer 418 and the antiferromagnetic layer 420 is used as a core 400, and terminals 402 are formed on both ends of the core 400.

A magnetized angle $\theta_1$ of the free layer 414 is freely changed corresponding to a magnetic field 404 from a recording bit 332 of a magnetic storage medium, but an magnetized angle $\theta_2$ of the fixed layer 418 remains fixed. Thus, a difference between a magnetized angle $\theta_1$ of the free layer 414 and the magnetized angle $\theta_2$ of the fixed layer 48 can be made large, and electric resistance changes of the core 400 at the time that the recording bit 332 comes nearer can be larger.

However, as a magnetic record medium has higher recording density, a track width $d_1$ is accordingly decreased. A core width $d_2$ of the magnetic head must be decreased to correspond to a decreased track width $d_1$. To this end, simply decreasing a core width $d_2$ makes electric resistance changes of the core 400 smaller, which leads to lower detection sensitivity. Accordingly, when a core width $d_2$ is decreased, a height h of the core 400 as well must be decreased.

However, when a height h of the core 400 is decreased, as shown in FIG. 6 a magnetic direction on the side of a signal detection plane 430 of the core 400 is not easily changed near the upper part of the core 400 under the influence of the demagnetizing field, and electric resistance changes of the core 400 are small. FIG. 6 indicates magnetic directions of the free layer 414 by the arrows when a height of the core 400 is, e.g., 5 μm. The region enclosed by the ellipse is a region where a magnetized angle $\theta_1$ becomes above a certain angle. As shown in FIG. 6, the region where a magnetized angle $\theta_1$ becomes above a certain angle, and additionally the magnetized angle $\theta_1$ is small.

Thus, the proposed magnetic head of the spin valve structure has the detection sensitivity much lowered when smaller-sized, and has found it difficult to adapt itself to higher density of the magnetic storage mediums.

In consideration of the above-described problems, a first object of the present invention is to provide a novel magnetic sensor, a magnetic head, and an encoder.

A second object of the present invention is to provide a magnetic sensor, a magnetic head and an encoder which have the tunnel junction, ensure rotation of magnetic directions of the free-side magnetic layer, and have good sensitivity.

A third object of the present invention is to provide a magnetic head which is adaptable to higher density of magnetic record mediums, and a hard disk device of a large storage capacity using the magnetic head.

DISCLOSURE OF THE INVENTION

The above-described objects are achieved by a magnetic sensor including a ferromagnetic tunnel junction, comprising: a free layer a magnetic direction of which freely rotates; and a barrier layer formed on the free layer and having a smaller thickness in a first region, a region of the free layer corresponding to the first region functioning as a sensor portion for sensing an external magnetic field. Rotation of magnetic directions in the free layer in a region corresponding to the first region can be secured enough. The magnetic sensor can have good sensitivity.

In the above-described magnetic sensor it is possible that the barrier layer is formed by oxidizing the surface of a metal.

In the above-described magnetic sensor it is possible that further comprising: a fixed layer formed on the barrier layer; and a antiferromagnetic layer formed on the fixed layer and fixing a magnetic direction of the fixed layer.

In the above-described magnetic sensor it is possible that the free layer in a region where the fixed layer is not formed is bent away from the fixed layer.

The above-described objects are achieved by a magnetic head comprising the magnetic sensor. Magnetic heads of high sensitivity can be provided.

The above-described objects are achieved by a magnetic encoder comprising the magnetic sensor. Magnetic encoders of high sensitivity can be provided.

The above-described objects are achieved by a magnetic head comprising a ferromagnetic tunnel junction element including a free layer a magnetic direction of which freely rotates, and a fixed layer which is opposed to one surface of the free layer through a barrier layer and a magnetic direction of which is fixed by a antiferromagnetic layer which is adjacent thereto, the free layer being connected to a member of high permeability. Magnetic heads which are adaptable to high recording density of magnetic storage mediums can be provided.

In the above-described magnetic head it is possible that the free layer is connected to the member of high permeability in a region spaced from a signal detection surface.

In the above-described magnetic head it is possible that the free layer is connected smoothly to the member of high permeability, neighboring the same.

In the above-described magnetic head it is possible that the member of high permeability is a shield layer formed, spaced from the ferromagnetic tunnel junction element.

In the above-described magnetic head it is possible that a thickness of the barrier layer near the edge of the fixed layer is larger than a thickness of the barrier layer near a central part of the fixed layer.

In the above-described magnetic head it is possible that the free layer is formed wider in a region spaced from the signal detection surface.

In the above-described magnetic head it is possible that the fixed layer is not exposed to the signal detection surface.

In the above-described magnetic head it is possible that the member of high permeability is grounded.

In the above-described magnetic head it is possible that the free layer in a region which is not opposed to the fixed layer is bent away from the fixed layer.

In the above-described magnetic head it is possible that the ferromagnetic tunnel junction element further includes another fixed layer which is opposed to the free layer through another barrier layer formed on the other surface of the free layer, a magnetic direction of said another fixed layer being fixed by another antiferromagnetic layer which is adjacent thereto.

The above-described objects are achieved by a hard disk device comprising the magnetic head. Hard disk devices of large storage capacities can be provided.

The above-described objects are achieved by a disk array device comprising a plurality of the hard disk devices. Disk array devices of large storage capacities can be provided.

BRIEF DESCRIPTION OF THE DRAWINGS

FIG. 1A shows a layer structure having the ferromagnetic tunnel structure, and FIG. 1B is a schematic view explaining measurement of resistance changes of the ferromagnetic tunnel structure shown in FIG. 1A.

FIG. 7A shows a spin valve element according to a first embodiment of the present invention, and FIG. 7B shows the previously proposed spin valve element as a control.

Figure 1A:
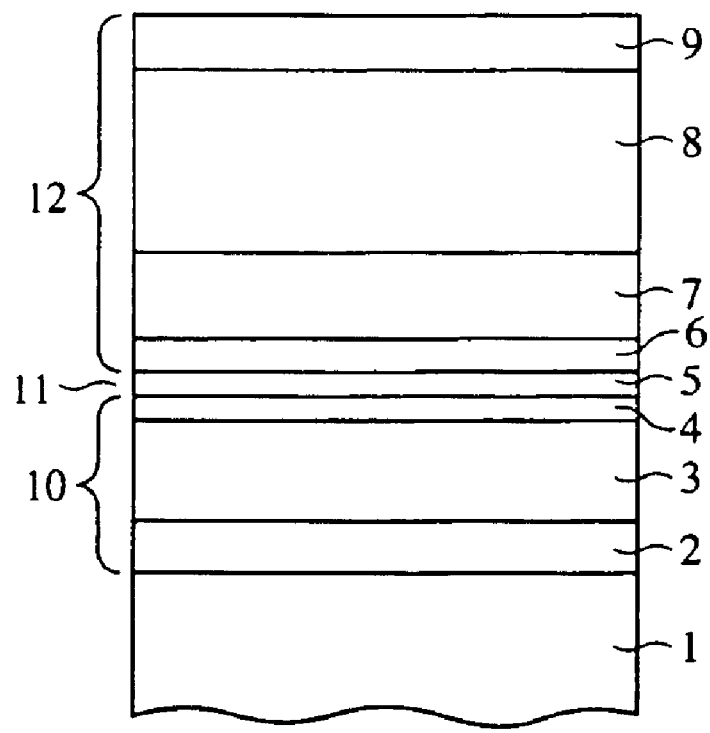
FIGS. 1A and 1B are views explaining the ferromagnetic tunnel structure.

BEST MODES FOR THE CARRYING OUT THE INVENTION (A First Embodiment)

The magnetic sensor according to a first embodiment of the present invention, and an embodiment of a method for fabricating the magnetic sensor will be explained with the drawings attached hereto. In the drawings the same members are represented by the same reference number not to repeat explanation.

(Magnetic Sensor)

Figure 7A:
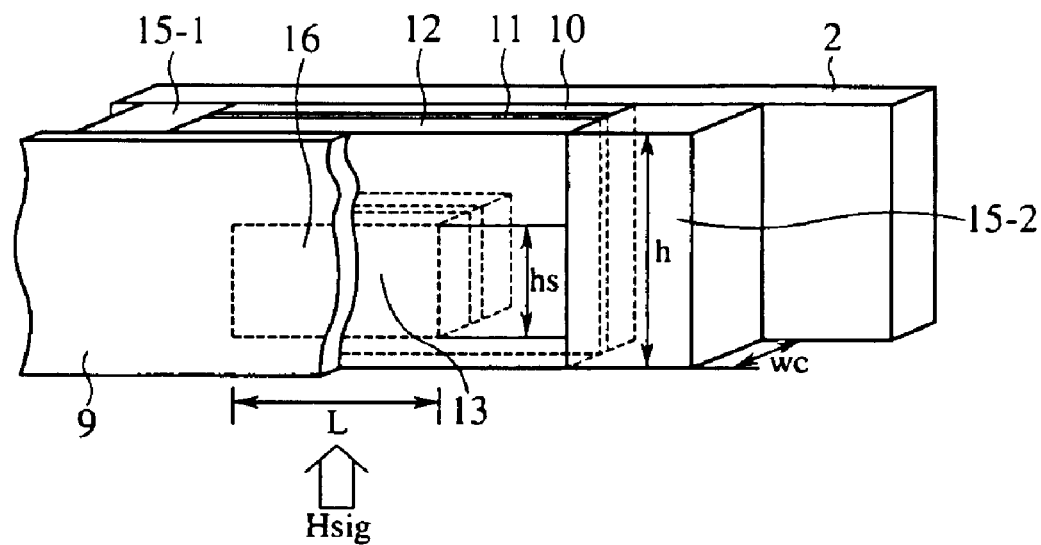
FIGS. 7A and 7B are views explaining a constitution of a spin valve element including the spin valve structure having a tunnel junction.
Figure 7B:
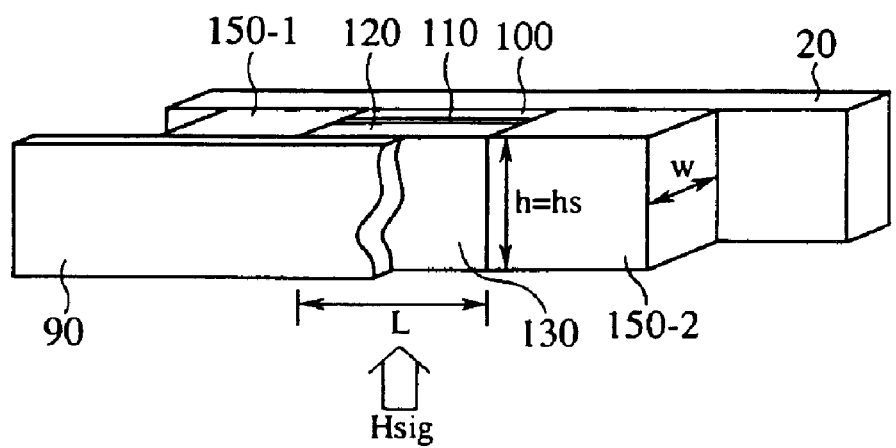

Here, a typical example of the magnetic sensor will be explained by means of the magnetic sensor having the spin valve structure. FIG. 7A is a view of a structure of the magnetic sensor according to the present embodiment, which has the spin valve structure and uses a tunnel junction. FIG. 7B shows, as a control, the structure of the magnetic sensor having the previously proposed spin valve structure.

As shown in FIG. 7A, the magnetic sensor according to the present embodiment has a tunnel junction of the spin valve structure disposed between a lower magnetic electrode 2 and an upper magnetic electrode 9. The spin valve structure has a layer structure including a barrier layer 11 disposed between the lower layer 10 and the upper layer 12.

Figure 8:
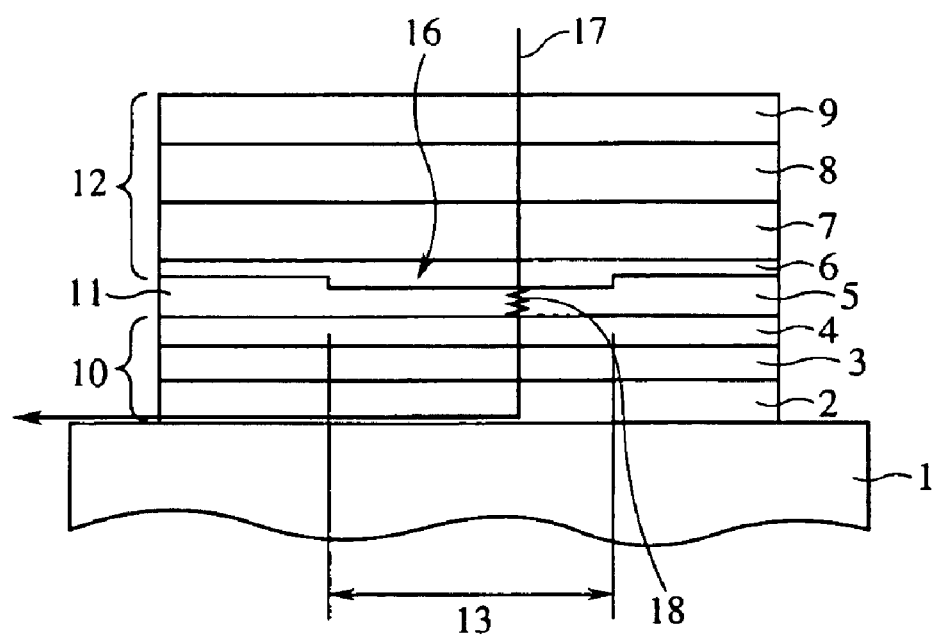
FIG. 8 is a view showing a constitution of the magnetic sensor according to the first embodiment of the present invention.

As will be detailed with reference to FIG. 8, this spin valve structure generally includes at least a magnetic layer on the free-side as the lower layer 10 and a first magnetic metal layer, and, as the upper layer 12, at least a second magnetic metal layer, a magnetic layer on the fixed-side and an antimagnetic layer. A thin insulation layer as the barrier layer 11 is disposed between the two magnetic metal layers. As shown in FIG. 8, a sensor portion 13 is formed in a region near the central part of the spin valve structure.

As an external magnetic field, a signal magnetic field Haig from a storage medium, such as a magnetic disk, is applied from below as viewed in the drawing to rotate magnetic directions of the free-side magnetic layer.

One characteristic of the magnetic sensor according to the present embodiment is that, as shown in FIG. 7A, the senor portion 13 for a signal magnetic field is limited to a part of the substantially central part of the tunnel junction having the spin valve structure (a region L×hs of a part of the magnetic layers).

As will be explained later, a size of the region of the sensor portion 13 is substantially equal to a size (h×L) of a region of the magnetic layers of the magnetic sensor which will be explained with reference to FIG. 7B. Accordingly, in the magnetic sensor according to the present embodiment the magnetic layers contain the sensor portion 13 at a part thereof, and a size of the magnetic layers is larger relative to that of the magnetic layers of the conventional magnetic sensor shown in FIG. 7B.

In the structure of the magnetic sensor having the previously proposed spin valve structure shown in FIG. 7B, the spin valve structure is disposed between a lower magnetic pole 20 and an upper magnetic pole 90. The layer structure of this conventional spin valve structure is the same as that of the spin valve structure shown in FIG. 7A, and includes a barrier layer 110 disposed between a lower layer 100 and an upper layer 120. The lower layer 100 and the upper layer 120 have the same layer structures as those explained with reference to FIG. 7A.

Similarly, a signal magnetic field $H_{sig}$ from a record medium, such as a magnetic disk as an external magnetic field is applied from below as viewed in the drawing to rotate magnetic directions of the free-side magnetic layer. In the magnetic sensor having the conventional spin valve structure, a sensor portion 130 for a signal magnetic field $H_{sig}$ is a part sandwiched by two insulation layers 150-1, 150-2 (the entire magnetic layers, i.e., h×L).

The magnetic sensor according to the present embodiment shown in FIG. 7A and the previously proposed magnetic sensor shown in FIG. 7B will be compared with each other. The sizes of both sensor portions 13, 130 are substantially equal to each other. However, the sensor portion 13 of the former (the present embodiment) is limited to a region which is a part of the magnetic layers while the sensor portion 130 of the latter (Control) is the entire magnetic layers. This is a difference between the two magnetic sensors.

The magnetic sensor 13 according to the present embodiment can set the sensor portion 13 at an arbitrary part of the magnetic layers by using the structure shown in FIG. 7A. Here, it is most preferable to set the sensor portion 13 near the substantially central part of the magnetic layers where magnetic directions of the free-side magnetic layer (one layer of the lower layer 10) can most easily rotate. Otherwise, the sensor portion 13 may be formed at a part of the magnetic layers which is as near a measured signal magnetic field as possible. Otherwise, the sensor portion 13 may be formed at a portion where magnetic directions of the magnetic layer can easily rotate.

In the magnetic sensor according to the present embodiment, because the sensor portion 13 is a part of the substantially central part of the magnetic layers, respective magnetic domains of the sensor portion 13 can freely rotate free from influence of a dimension of the height of the magnetic layers in the direction of the device height h. That is, because a height ha of the sensor portion 13 is a part of a height h of the magnetic layers, the magnetic domains can freely rotate corresponding to external signal magnetic fields $H_{sig}$ even near the edge of the sensor portion 13. Furthermore, because the magnetic layers are larger for the size of the sensor portion, influences, antimagnetic fields, etc. due to a device configuration can be decreased.

In contrast to this, in the previously proposed magnetic sensor (see FIG. 7B), the entire region of the free-side magnetic layer is the sensor portion 130, whereby respective magnetic domains of the sensor portion 130 do not easily rotate under influence of a dimension h (=$h_s$) in the direction of the height of the magnetic layers.

FIG. 8 is a detailed sectional view of the magnetic sensor according to the present embodiment shown in FIG. 7A. A layer structure of the magnetic sensor includes a substrate 1, a lower layer 10 formed on the substrate, and a barrier layer 11 formed on the lower layer, and an upper layer 12 formed on the barrier layer.

The lower layer 10 includes a lower electrode 2, a free-side magnetic layer (a lower layer and free layer) 3, and a first magnetic metal layer 4 formed on the free-side magnetic layer. The barrier layer 11 includes an insulation layer 5. The upper layer 12 includes a second magnetic metal layer 6 formed on the insulation layer 5, a fixed-side magnetic layer 7 formed on the second magnetic metal layer, an antiferromagnetic layer 8 formed on the fixed-side magnetic layer, and an upper electrode 9 formed on the antiferromagnetic layer.

The insulation layer 5 has a region at a part of the central part thereof, which has a film thickness reduced relative to a film thickness of the rest part thereof. Accordingly, the second magnetic metal layer 6 formed on the insulation film 5 has a flat upper surface but a central portion of corresponding to the thickness-reduced central part of the insulation film 5, which increases a thickness downward in comparison with the rest part thereof, forming a downward convexity. The concavity formed in the insulation film 5 is some angstroms. A region corresponding to the central concavity (concave region) 16 forms the sensor portion 13, which has been explained with reference to FIG. 7A.

The respective members of the magnetic sensor will be explained.

The substrate 1 is formed of preferably an Si substrate with a natural oxide film formed on.

The lower electrode 2 is formed of preferably an about 50 nm-thickness Ta film.

The free-side magnetic layer 3 is formed of preferably an about 17 nm-thickness NiFe film.

The first magnetic metal layer 4 is formed of preferably an about 3.3 nm-thickness Co film.

The insulation film 5 is formed of a some angstroms (Å) to tens Å thickness aluminum oxide film. In the present embodiment, the concave portion 16 is formed of an about 1.3 nm-thickness aluminum oxide film and the rest part is formed of an about 3.3 nm-thickness aluminum oxide film.

The second magnetic metal layer 6 is formed of preferably an about 3.3 nm-thickness Co film as is the first magnetic metal layer 4. The first and the second magnetic metal layers 4, 6, the Co film of which have higher polarizability than that of the NiFe film (of the free-side magnetic layer 3 or the fixed-side magnetic layer 7), are provided to lay the Co film on the free-side magnetic layer 3 or the fixed-side magnetic layer 7 to thereby attain high MR ratio.

The fixed-side magnetic layer 7 is formed of preferably an about 17 nm-thickness NiFe film, as is the free-side magnetic layer 3.

The antiferromagnetic layer 8 is formed of preferably an about 50 nm-thickness FeMn film.

The upper electrode 9 is formed of preferably an about 50 nm-thickness Ta film, as is the lower electrode 2.

The magnetic sensor according to the present embodiment uses TMR (tunnel MR) provided by applying a ferromagnetic tunnel junction to a spin valve structure. The spin valve structure has the Co layers 4, 6 disposed between two magnetic layers (i.e., the free-side magnetic layer 3 and the fixed-side magnetic layer 7), and the antiferromagnetic layer 8 provided on the upper surface of the fixed-side magnetic layer 7 so as to fix a magnetic direction of the fixed-side magnetic layer 7 and the second magnetic metal layer 6 alone. The ferromagnetic tunnel junction has the thin oxide film 5 as the barrier layer 11 disposed between the two ferromagnetic layers 3, 7 (more specifically the first and the second magnetic metal layers 4, 6).

The function of the magnetic sensor according to the present embodiment will be explained. The insulation layer 5 has a reduced thickness at the sensor portion 13, which is smaller relative to that of the rest part thereof. Tunnel resistance R in the direction of thickness of the insulation layer 5 much depends on a thickness of the insulation layer 5 as expressed below.

$$R \propto t \times \exp[t] \quad (4)$$

where t represents a thickness of the insulation layer.

Accordingly, when direct current is applied between the lower electrode 2 and the upper electrode 9, tunnel current 18 flows concentratedly through the region where the insulation layer 5 is thin. That is, the direct current flows from the upper electrode 9 to the lower electrode 2 through regions of the respective layers from the antiferromagnetic layer 8 to the free-side magnetic layer 3, which (regions) correspond to the thickness-reduced region 16 of the insulation layer 5. Consequently, the regions corresponding to the concavity 16 having the reduced thickness substantially functions as the sensor portion 13.

Figure 1B:
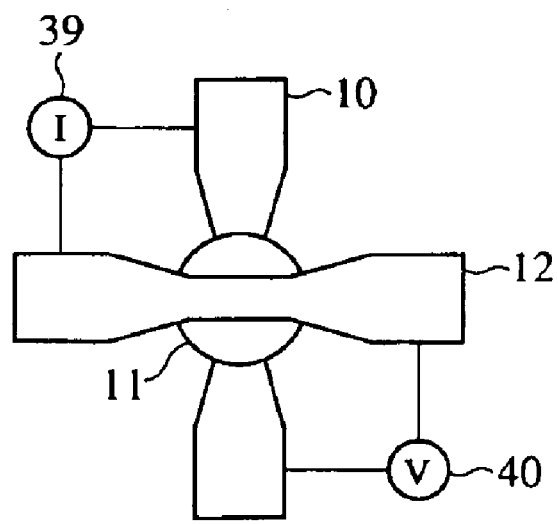
Figure 2:
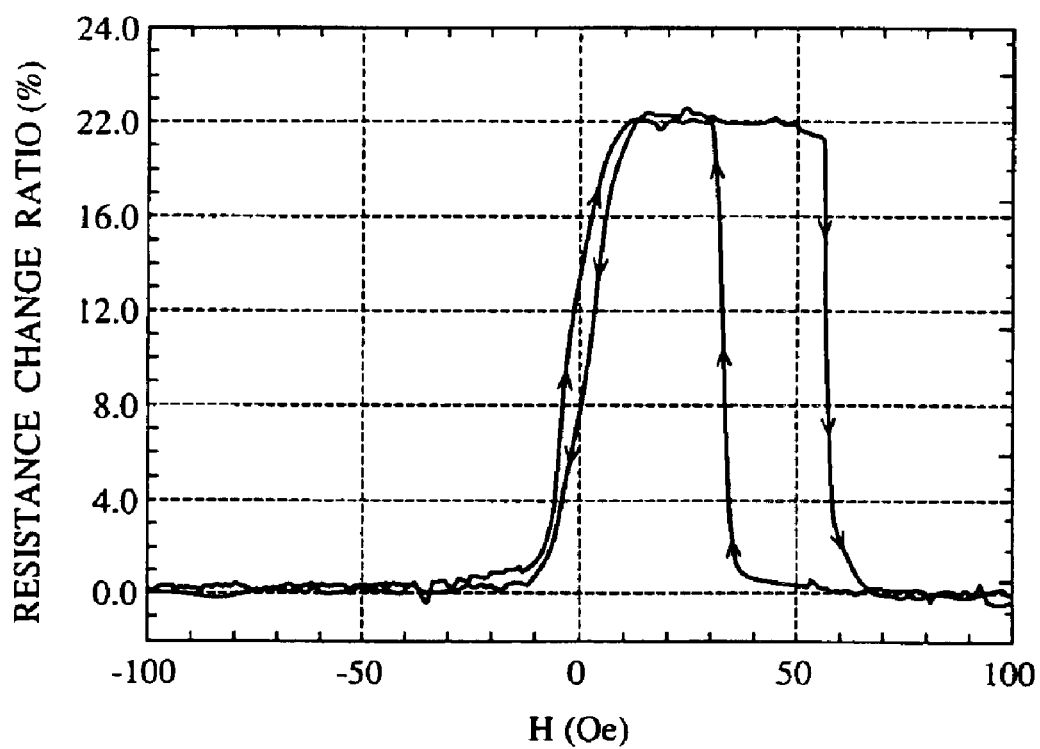
FIG. 2 is a graph of magnetic field—resistance characteristics of the tunnel junction shown in FIG. 1.
Figure 3:
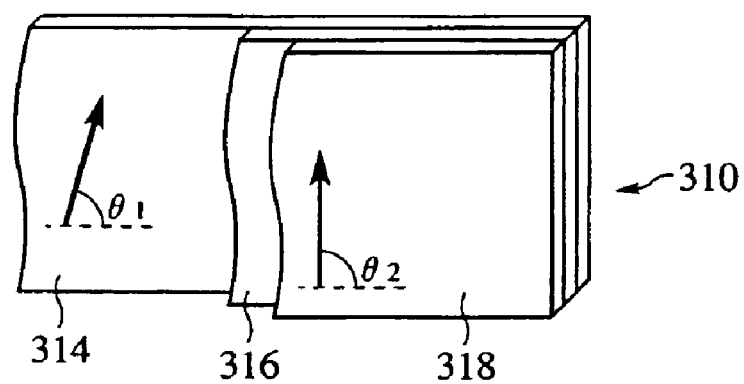
FIG. 3 is a conceptual view of the GMR effect.
Figure 4:
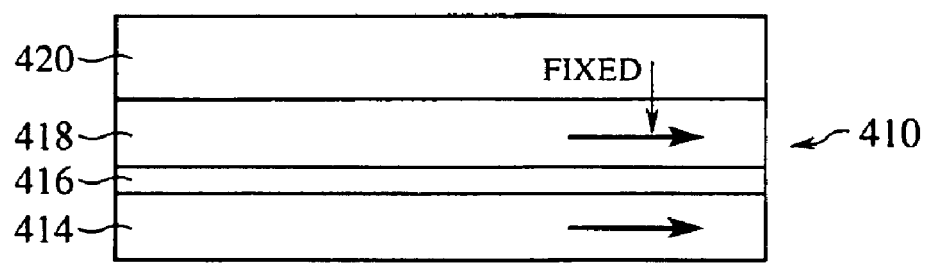
FIG. 4 is a sectional view of a layer film of a spin valve structure.
Figure 5:
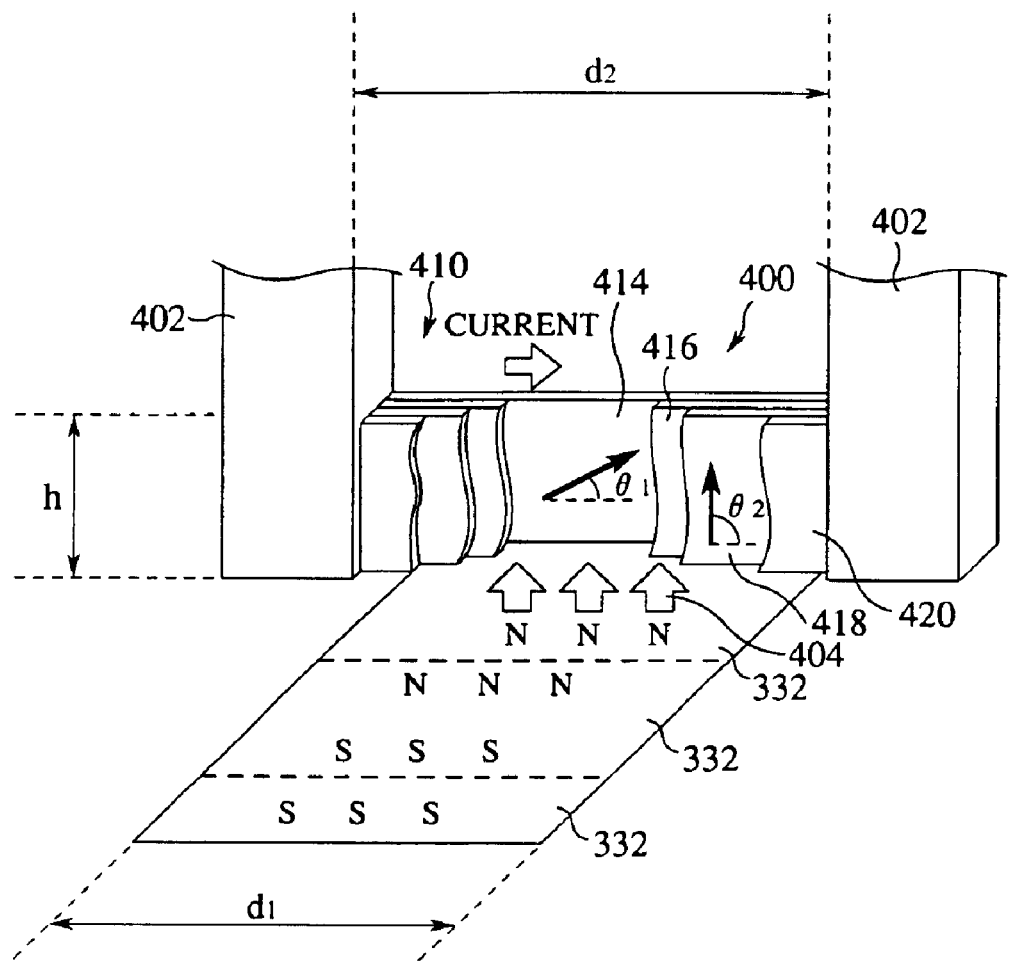
FIG. 5 is a perspective view explaining an operational principle of a magnetic head using the spin valve structure.

As described above, in the ferromagnetic tunnel junction, a tunnel resistance R can be expressed by the formula (1) when a relative angle between magnetic directions of the magnetic layers on both sides is represented by θ. That is, magnetic directions of the free-side magnetic layer 3 and the magnetic metal layer 4 rotate corresponding to an external signal magnetic field Haig, and a tunnel resistance R, which is determined by a relative angle θ between magnetic directions of the magnetic metal layers 4, 6 on both sides, changes. As explained with reference to FIG. 1B, when a certain direct current is applied between the lower electrode 2 and the upper electrode 9, a corresponding tunnel resistance R can be detected as a voltage value. Thus, the magnetic sensor can detect the external signal magnetic field $H_{sig}$.

As shown in FIGS. 8 and 7A, the sensor portion 13 is formed in a partial region of the magnetic layers. Preferably, the sensor portion 13 is formed substantially at the central part of the magnetic layers. A size of the sensor portion 13 is the same as that of the magnetic layer region (i.e., the sensor portion 130 in FIG. 7B) of the above-proposed magnetic sensor. Accordingly, the sensor portion 13 can be formed at a proximal location in the magnetic layer region.

Otherwise, the sensor portion 13 can be formed substantially at the central part of the magnetic layers. Otherwise, the sensor portion 13 can be formed at a location which is near a measured signal magnetic field as much as possible. Consequently, in the free-side magnetic layer 3, magnetic directions can rotate in respective magnetic domains without influence of the edges of the magnetic layers.

(Method for Fabricating the Magnetic Sensor)

The method for fabricating the magnetic sensor explained with reference to FIGS. 7A and 8 will be explained with reference to FIG. 9A to FIG. 12C. The method for fabricating the magnetic sensor is varied by different methods for forming the thin insulation layer region. A first fabrication method will be explained with reference to FIG. 9A to FIG. 10C, and a second fabrication method will be explained with reference to FIG. 11A to FIG. 12C.

(A First Fabrication Method)

FIG. 9A to FIG. 10C are views continuously explaining the first fabrication method.

Figure 9A:
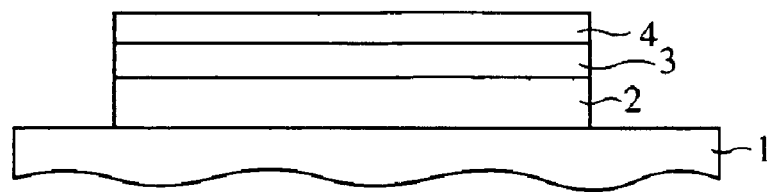
FIG. 9 is views explaining a first method for fabricating the magnetic sensor shown in FIG. 8 (Part 1).

As shown in FIG. 9A, an Si substrate 1 with a natural oxide film formed on is prepared. An about 50 nm-thickness Ta film is formed on the substrate 1 by sputtering. The Ta film functions as the lower electrode 2 when the device is completed. An about 17 nm-thickness NiFe film is formed on the lower electrode 2 with an about 300 (Oe) magnetic field being applied, and furthermore, an about 3.3 nm-thickness Co film is formed. When the device is completed, the free-side magnetic layer (the lower layer, the free layer) 3 of the NiFe film, and the first magnetic metal layer 4 of the Co film function as the free layer.

Figure 9B:
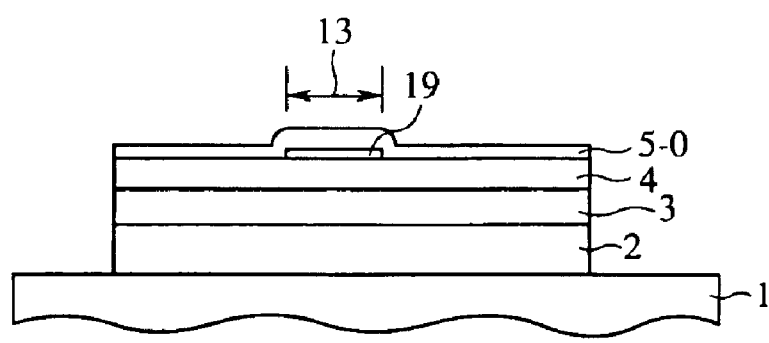

As shown in FIG. 9B, a resist 19 is applied to the sensor portion 13, and then, an about 2.0 nm-thickness Al film 5-0 which is to function as the insulation layer 5 is formed on the resist 19 and the first magnetic metal layer 4.

Figure 9C:
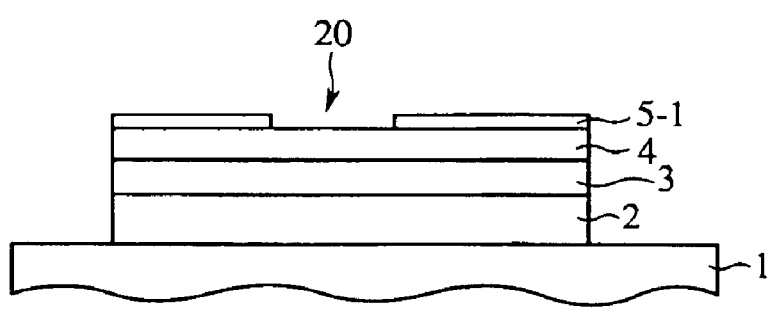
Figure 9D:
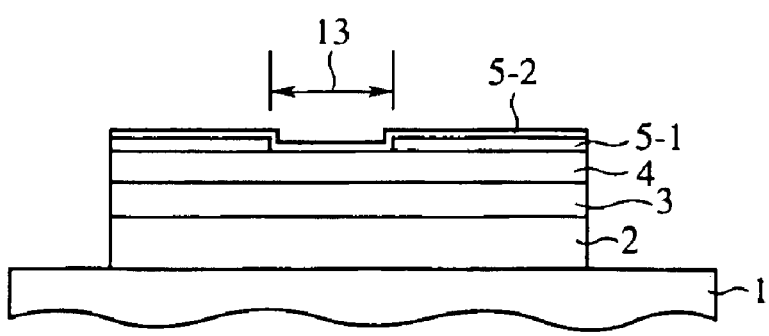

As shown in FIG. 9C, the surface of the Al film is oxidized by plasma oxidation to form a first aluminum oxide film 5-1 (i.e., Al—$Al_2O_3$ film). Then, the resist 19 is removed. The aluminum oxide film is to be the thin insulation film 5, which will function as the tunnel barrier after the device is completed.

As shown in FIG. 9D, again an about 1.3 nm-thickness Al film is formed. Similarly, the surface of the Al film is oxidized by plasma oxidation to form the second aluminum oxide film 5-2. Thus, the insulation film 5 of the first aluminum oxide film 5-1 and the second aluminum oxide film 5-2 has an about 1.3 nm-thickness at the sensor portion 13 and an about 3.3 nm-thickness at the rest part. The region of the insulation film 5 which has the reduced thickness functions as the tunnel barrier after the device is completed.

Figure 10A:
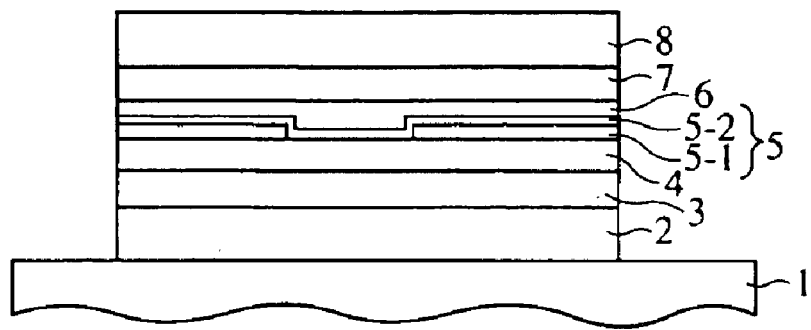
FIG. 10 is views explaining the first method for fabricating the magnetic sensor shown in FIG. 8 (Part 2).

As shown in FIG. 10A, a 3.3 nm-thickness Co film is formed on the thin insulation film 5.

Then, an about 17 nm-thickness NiFe film is formed on the Co film. Furthermore, an about 50 nm-thickness FeMn film is formed. When the device is completed, the second magnetic metal layer 6 of the Co film and the fixed-side magnetic layer 7 of the NiFe film are the pin layer (fixed layer), and the FeMn film functions as the antiferromagnetic layer 8.

Figure 10B:
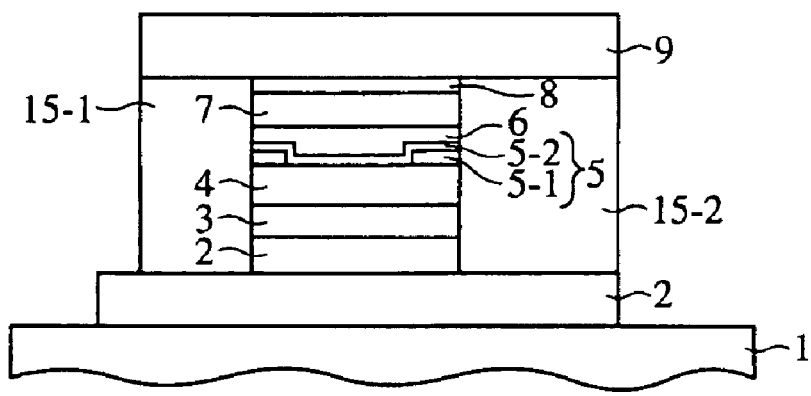

As shown in FIG. 10B, part except the device portion is removed by ion milling, RIE (reactive ion etching) or others, and the insulation layers 15-1, 15-2 are formed a the removed part. Then, an about 50 nm-thickness Ta film is formed on the insulation layers 15-1, 15-2 and the antiferromagnetic layer 8. The Ta film functions as the upper electrode 9 when the device is completed. The insulation layers 15-1, 15-2 are provided for prohibiting the upper electrode 9 and the lower electrode 2 from contacting each other directly or via the edge surfaces.

Figure 10C:
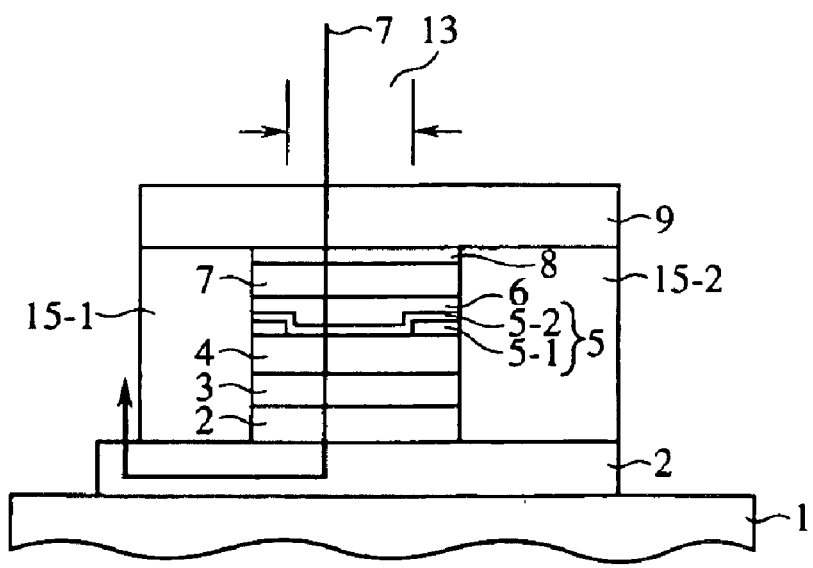

As shown in FIG. 10C, in the thus-fabricated magnetic sensor, when sense current (a certain direct current) 17 is applied from the upper electrode 9 to te lower electrode 2, tunnel current passing through the insulation film 5 of aluminum oxide flows concentratedly on the relatively thin portion. This portion functions as the sensor portion 13. The thickness reduced portion can be formed at an arbitrary part within the magnetic layers, preferably at substantially central part of the free-side magnetic layer 3 where magnetic domains of the free-side magnetic layer 3 can most easily rotate, whereby smooth rotation of the magnetic domains can be ensured.

(A Second Fabrication Method)

FIGS. 11A to 12C are view continuously explaining a second fabrication method of the magnetic sensor. The second fabrication method is different from the first fabrication method in the steps of forming the thin insulation film.

Figure 11A:
FIG. 11 is views explaining a second method for fabricating the magnetic sensor shown in FIG. 8 (Part 1).

As shown in FIG. 11A, an Si substrate 1 with a natural oxide film formed on is prepared. An about 50 nm-thickness Ta film is formed on the substrate 1 by sputtering. The Ta film functions as the lower electrode 2 when the device is completed. An about 17 nm-thickness NiFe film is formed on the lower electrode 2 with an about 300 (Oe) magnetic field being applied, and furthermore, an about 3.3 nm-thickness Co film is formed. When the device is completed, the free-side magnetic layer 3 of the NiFe film, and the first magnetic metal layer 4 of the Co film function as the free layer. The steps up to here are the same as those of the first fabrication method.

Figure 11B:
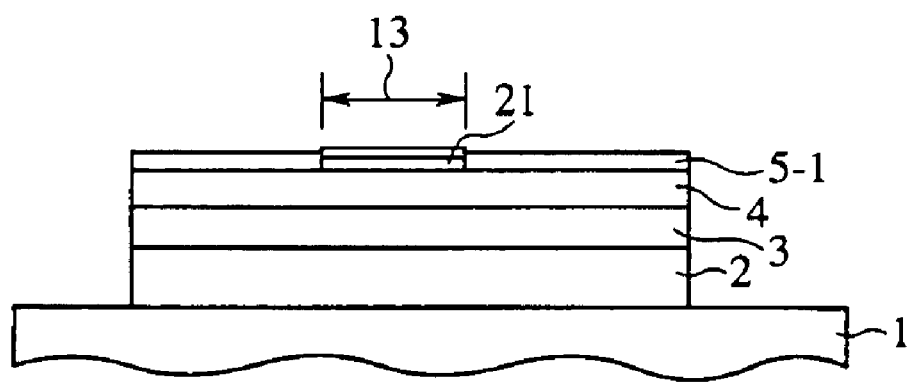

As shown in FIG. 11B, a resist 21 is applied to the sensor portion 13. Then, an about 2.0 nm-thickness first $Al_2O_3$ film 5-1 is formed on the resist and the first magnetic metal layer 4.

Figure 11C:
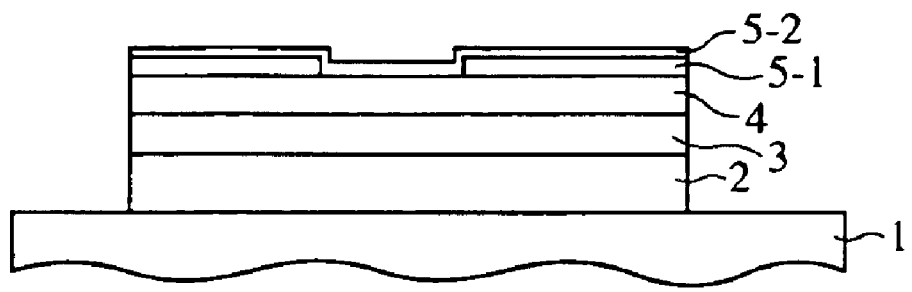

As shown in FIG. 11C, the resist 21 is removed, and then an about 1.3 nm-thickness Al film is formed, and the surface of the Al film is oxidized by plasma oxidation to form an aluminum oxide film (a second $Al_2O_3$ film) 5-2. Thus, the insulation layer 5 formed of the first aluminum oxide film 5-1 and the second aluminum oxide film 5-2 has an about 1.3 nm-thickness at the sensor portion 13 and an about 3.3 nm-thickness at the rest part. The partially thickness reduced part of the insulation film 5 functions as the tunnel barrier when the device is completed.

Figure 12A:
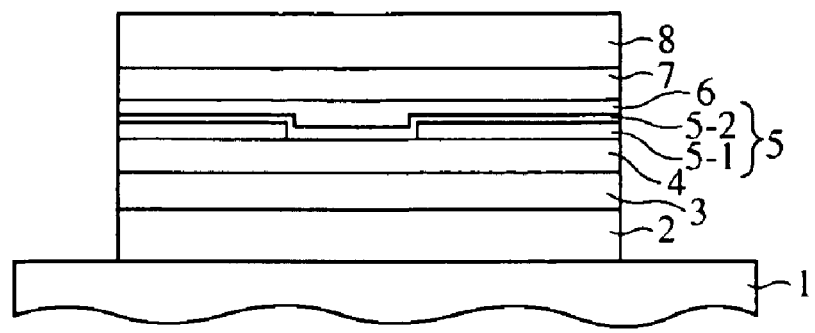
FIG. 12 is views explaining the second method for fabricating the magnetic sensor shown in FIG. 8 (Part 2).

Then, the same fabrication steps as those of the first fabrication method follow. That is, as shown in FIG. 12A, an about 3.3 nm-thickness Co film as the second magnetic metal layer 6 is formed on the thin insulation film 5. Then, an about 17 nm-thickness NiFe film 7 as the fixed-side magnetic layer 7 is formed on the second magnetic metal layer 6. Furthermore, an about 50 nm-thickness FeMn film as the antiferromagnetic layer 8 is formed on the fixed-side magnetic layer 7.

Figure 12B:
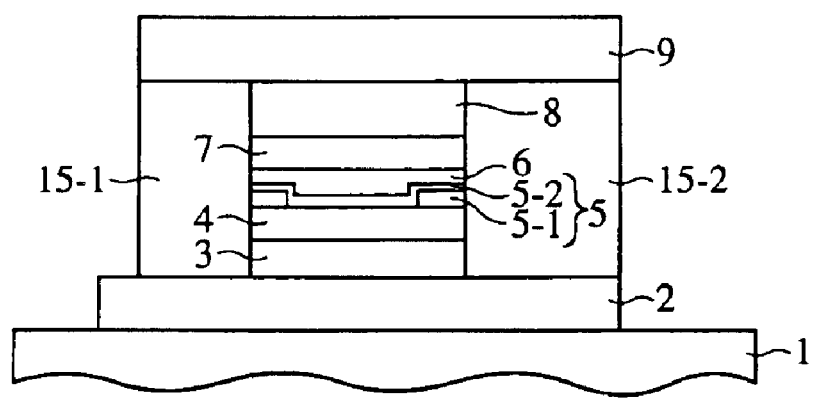
Figure 12C:
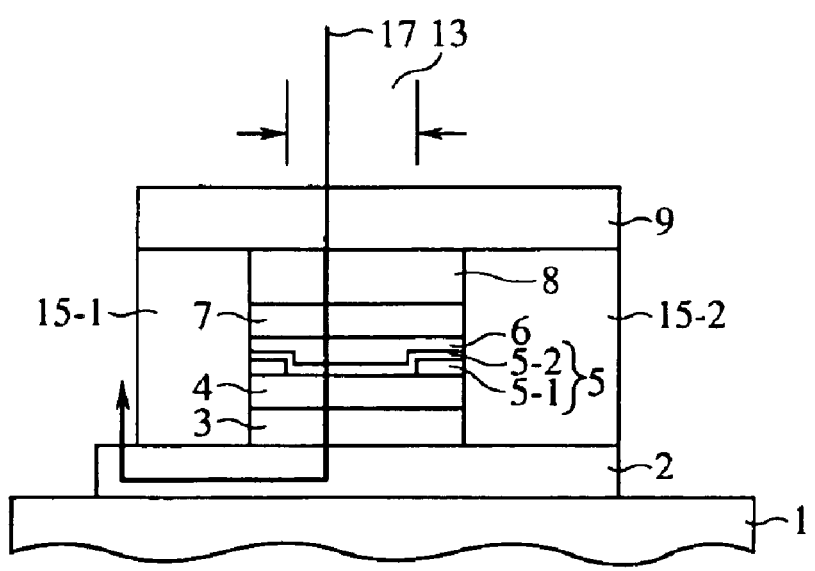

As shown in FIG. 12B, the part except the device part is removed by ion milling, RIE or other technique, and an insulation layers 15-1, 15-2 are formed at the removed part. Then, an about 50 nm-thickness Ta film as the upper electrode 9 is formed on the insulation layers 15-1, 15-2 and the antiferromagnetic layer 8.

In the thus-fabricated magnetic sensor, when sense current (a certain direct current) 17 is applied from the upper electrode 9 to te lower electrode 2, tunnel current passing through the insulation film 5 of aluminum oxide flows concentratedly on the relatively thin sensor portion 13. This portion functions as the sensor portion 13. The thickness reduced portion can be formed at an arbitrary part within the magnetic layers, preferably at substantially central part where magnetic domains of the free-side magnetic layer 3 can most easily rotate, whereby smooth rotation can be ensured in these magnetic domains.

(Application Example to Magnetic Head)

The above-described magnetic sensor is typically applicable to magnetic heads. Recently as a magnetic head, a composite-type magnetic head using as the magnetic head an inductive head for recording, and a GMR head for reproduction which are integrated with each other has been developed and is practically used.

The GMR head typically has the spin valve structure (but has no tunnel junction). In place of the GMR head of the composite-type magnetic head, the magnetic sensor of the spin valve structure having the above-described tunnel junction is applicable as it is.

(Other Application Examples)

An example of the application of the magnetic sensor according to the present invention to a magnetic encoder will be explained.

Figure 13A:
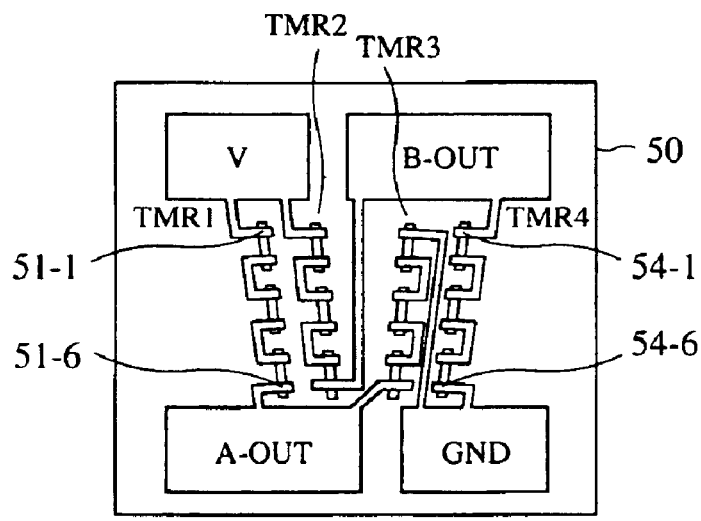
FIG. 13A is a view showing a magnetic sensor.

FIG. 13A is a view showing the magnetic sensor 50 according to the present invention, which is applied to a magnetic encoder. The magnetic sensor 50 includes an electric source terminal V, a ground terminal GND, an output A-terminal A-OUT and an output B-terminal B-OUT. As the magnetic sensor 50, a first ferromagnetic tunnel junction element $TMR_1$ is jointed inserted between the electric source terminal V and the output A-terminal A-OUT, a second ferromagnetic tunnel junction element $TMR_2$ is inserted between the electric source terminal V and the output B-terminal B-OUT, a third ferromagnetic tunnel junction element $TMR_3$ is inserted between the ground terminal GND and the output A-terminal A-OUT, and a fourth ferromagnetic tunnel junction element $TMR_4$ is inserted between the ground terminal GND and the output B-terminal B-OUT.

Each of the ferromagnetic tunnel junction elements (i.e., $TMR_1$ to $TMR_4$) has 6 tunnel junctions (51-1 to 51-6, 52-1 to 52-6, 53-1 to 53-6, 54-1 to 54-6) which are serially connected. Each of the tunnel junctions 51-1 to 54-6 has an about 50 μm×50 μm junction area.

Figure 13B:
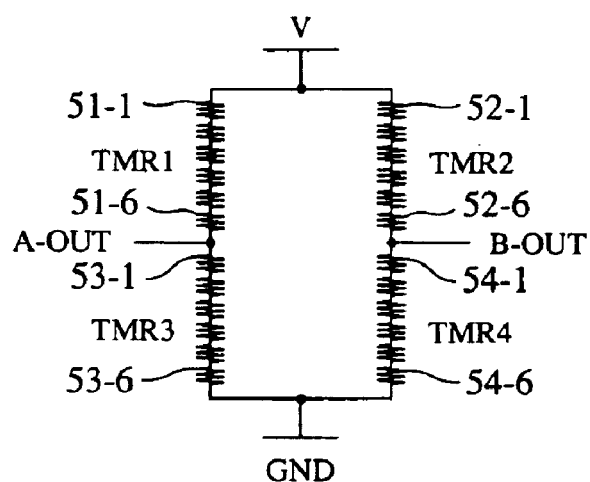
FIG. 13B is a view of an equivalent circuit of the magnetic sensor.

FIG. 13B is a circuit diagram equivalent to the magnetic sensor 50 shown in FIG. 13A.

Figure 13C:
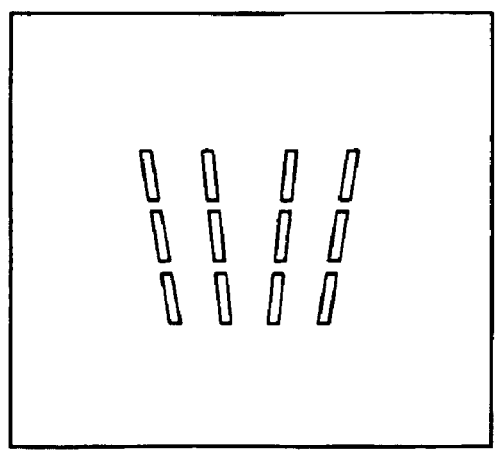
FIG. 13C is a view explaining a mask used in the magnetic sensor fabrication.

A method for fabricating the magnetic sensor shown in FIG. 13A will be briefly explained. First, using the mask shown in FIG. 13C an about 17 nm-thickness NiFe film as the free-side magnetic layer is formed, and continuously, an about 3.3 nm-thickness Co film is formed as a first magnetic metal layer.

The mask is replaced, and then an about 1.3 nm-thickness Al film is formed as an insulation layer, and the surface of the Al film is oxidized. The oxidation is performed by the plasma oxidation explained in the first and the second fabrication methods to form a thinner oxide film at the sensor portion and a relatively thick oxide film in the rest region. The oxidation may be performed by, e.g., natural oxidation.

After the formation of the oxide film, the mask is replaced, and an about 3.3 nm-thickness Co film as a second magnetic metal film is formed, an about 17 nm-thickness NiFe film as a fixed-side magnetic layer is formed, and an about 45 nm-thickness FeMn film as an antiferromagnetic layer is formed. Furthermore, an about 8 nm-thickness Ta film as an upper electrode is formed. Thus, the magnetic encoder can be formed of the same layer structure as the spin valve-type magnetic sensor and can be fabricated by the same fabrication steps as the spin valve-type magnetic sensor.

Next, the operation of the magnetic encoder will be explained.

Figure 14A:
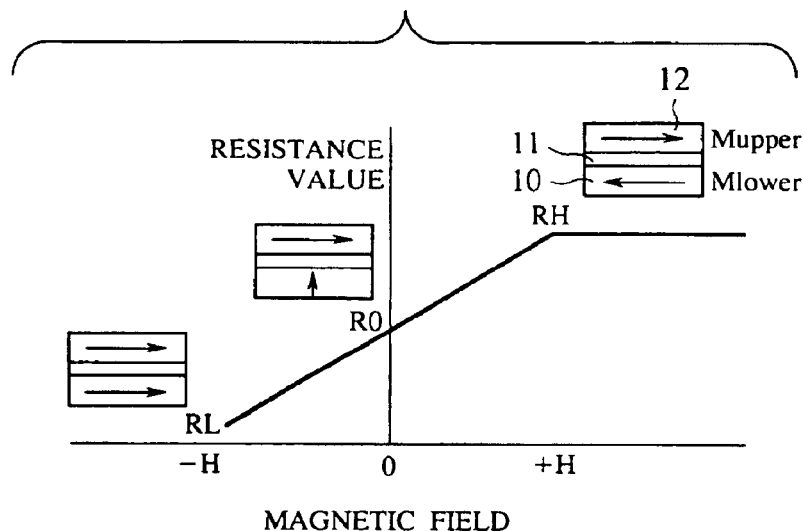
FIG. 14A is a view showing output characteristics of the magnetic sensor.

FIG. 14A is a view schematically showing a magnetoresistance curve of the magnetic encoder shown in FIG. 13A. As explained with reference to Formula (1), a magnetic direction $M_{upper}$ of the upper layer 12 of the ferromagnetic tunnel junction element TMR is fixed by the antiferromagnetic layer (FeMn film) 8 so that a magnetic direction $M_{lower}$ of the lower layer 10 is orthogonal to a magnetic direction $M_{lower}$ of the lower layer 10. As shown in FIG. 14A, when an external magnetic field is applied to the ferromagnetic tunnel junction element TMR in the same direction as a magnetic direction $M_{upper}$ of the upper layer 12 (i.e., an external magnetic field −H), a magnetic direction $M_{upper}$ of the upper layer 12 and that $M_{lower}$ of the lower layer 10 are parallel with each other in the same direction. That is, a relative angle θ between the two magnetic directions is 0°, and, based on Formula (1), a resistance value of the ferromagnetic tunnel junction element TMR is minimum, and $R=R_s$. A minimum resistance value at this time is represented by $R_L$.

When an external magnetic field is zero for the ferromagnetic tunnel junction element TMR, a magnetic direction $M_{lower}$ of the lower layer 10 rotates, and a relative angle θ between magnetic directions of the upper layer 12 and the lower layer 10 is 90°. Based on Formula (1), a resistance value of the ferromagnetic tunnel junction element TMR is $R=R_s 0.5×\Delta R$. A resistance value given when an external magnetic field is zero is represented by $R_o$.

When an external magnetic field is applied to the ferromagnetic tunnel junction element TMR in a direction opposite to a magnetic direction $M_{upper}$ of the upper layer 12 (i.e., an external magnetic field H), a magnetic direction $M_{lower}$ of the lower layer 10 rotates, and a magnetic direction of $M_{upper}$ of the upper layer 12 and a magnetic direction $M_{lower}$ of the lower layer 10 are parallel with each other in opposite directions. That is, relative angle θ is 180°, based on Formula (1), a resistance value of the ferromagnetic tunnel junction element TMR is maximum, and $R=R_s+\Delta R$. A maximum resistance value at this time is represented by $R_H$.

Thus, when an external magnetic field is −H, 0, +H, a resistance value of the ferromagnetic tunnel junction element TMR is $R_L$, $R_o$ and $R_H$, and $R_L<R_o<R_H$. FIG. 14A graphs this relationship.

Figure 14B:
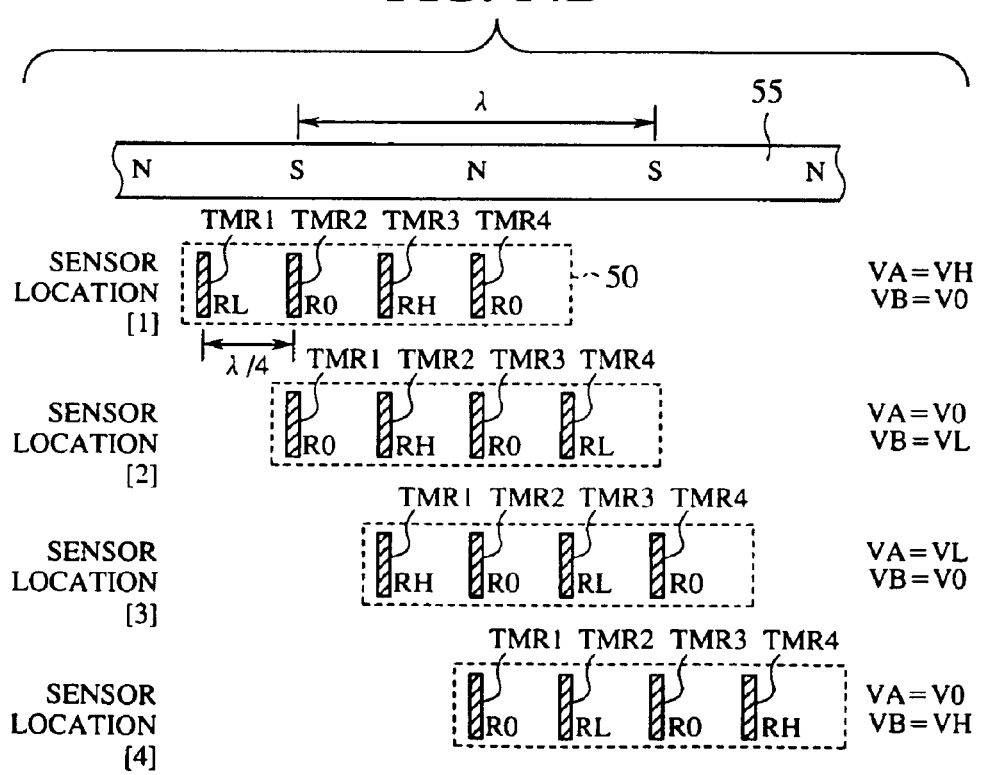
FIG. 14B is a view explaining an operational principle of the magnetic sensor.

FIG. 14B is a view explaining an operational principle of the encoder. A magnetic field generating magnet to be measured 55 and a magnetic sensor 50 formed of tunnel junction elements TMR have the positional relationship with each other as shown. The magnetic field generating magnet 55 is an elongate magnetic body magnetized alternately with N pole and S pole, and a gap between the S and N poles of one pair is λ. The $TMR_1$ to the $TMR_4$ of the magnetic sensor 50 are arranged near the magnetic field generating magnet 55 relatively displaceably in the longitudinal direction of the magnetic field generating magnet 55 and in parallelism therewith.

That is, initially, the magnetic sensor 50 including the tunnel junction elements $TMR_1$ to $TMR_4$ is located at a sensor position [1]. The respective ferromagnetic tunnel junction elements $TMR_s$ are arranged at a λ/4 gap. After a ceratin time t determined by a displacement speed, the magnetic sensor 50 is displaced right by λ/4 parallelly with the magnet 55 to located at the sensor position [2]. In the drawing, however, the sensor position [2] is shown away from the magnetic field generating magnet 55 because if the sensor position [2] is shown, overlapping the sensor position [1], the drawing will make the understanding difficult. It should be noted that actually the magnetic sensor 55 is relatively displaced in the longitudinal direction of the magnetic field generating magnet 55 in parallelism therewith over a position near the magnet 55. This is true with the sensor positions [3] and [4].

Furthermore, after the time t, the magnetic sensor 50 at the sensor position [2] is located at the sensor position [3], and then after the time t, the magnetic sensor 50 is located at the sensor position [4]. Thus the magnetic sensor 50 makes the parallel displacement.

Figure 15A:
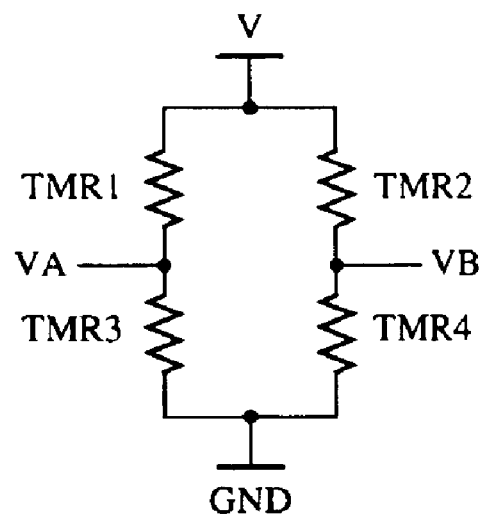
FIG. 15A is an equivalent circuit used in explaining an operational principle of the magnetic sensor.

First, at the sensor position [1] in FIG. 14B, the respective tunnel junction elements have $TMR_1=R_L$, $TMR_2=R_o$, $TMR_3=R_H$ and $TMR_4=R_o$ under the influence of an external magnetic field from the magnetic field generating magnet 55. FIG. 15A corresponds to FIG. 13B. In this equivalent circuit, the voltage output $V_A$ and the voltage output $V_B$ of the output A-terminal and the output B-terminal respectively divide a voltage V to the $TMR_1$ and the $TMR_3$ and a voltage V to the $TMR_2$ and the $TMR_4$. The following formula is obtained.

$$V_A = V \times TMR_3 / (TMR_1 + TMR_3) \quad (5)$$
$$= V \times R_H / (R_L + R_H)$$

$$V_B = V \times TMR_4 / (TMR_2 + TMR_4) \quad (6)$$
$$= V \times R_0 / (R_0 + R_0)$$

Here, the following formulas are derived from the results of Formulas (5) and (6).

$$V_A = V \times R_H / (R_L + R_H) = V_H \quad (7)$$

$$V_B = V \times R_o / (R_o + R_o) = V/2 = V_o \quad (8)$$

Then, at the sensor position [2] in FIG. 14B, $TMR_1=R_o$, $TMR_2=R_H$, $TMR_3=R_o$, $TMR_4=R_L$ Accordingly, voltage outputs $V_A$, $V_B$ of the output A-terminal and the output B-terminal are as follows.

$$V_A = V \times TMR_3 / (TMR_1 + TMR_3) \quad (9)$$
$$= V \times R_0 / (R_0 + R_0) = V/2 = V_0$$

$$V_B = V \times TMR_4 / (TMR_2 + TMR_4) \quad (10)$$
$$= V \times R_L / (R_H + R_L)$$

Here, the following formula can be derived from the result of Formula (10).

$$V_A = V \times R_L / (R_L + R_B) = V_L \quad (11)$$

Similarly, at the sensor position [3] in FIG. 14B, TMR1=$R_H$, TMR2=$R_o$, TMR3=$R_L$, TMR4=$R_o$ Accordingly voltage outputs $V_A$, $V_B$ of the output A-terminal and the output B-terminal are as follows.

$$V_A = V \times TMR_3 / (TMR_1 + TMR_3) \quad (12)$$
$$= V \times R_L / (R_H + R_L) = V_L$$

$$V_B = V \times TMR_4 / (TMR_2 + TMR_4) \quad (13)$$
$$= V \times R_0 / (R_0 + R_0) = V/2 = V_0$$

Similarly, at the sensor position [4] in FIG. 14B, TMR1=$R_O$, TMR2=$R_L$, TMR3=$R_O$, TMR4=$R_H$ Accordingly, voltage outputs $V_A$, $V_B$ of the output A-terminal and the output B-terminal are as follows.

$$V_A = V \times TMR_3 / (TMR_1 + TMR_3) \quad (14)$$
$$= V \times R_0 / (R_0 + R) = V/2 = V_0$$

$$V_B = V \times TMR_4 / (TMR_2 + TMR_4) \quad (15)$$
$$= V \times R_H / (R_L + R_H) = V_H$$

Figure 15B:
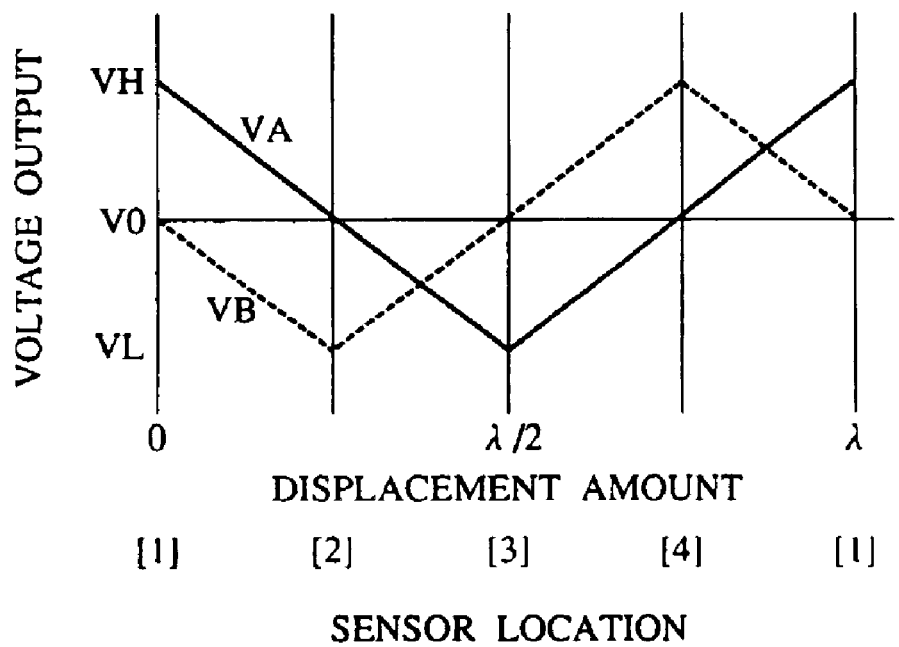
FIG. 15B is a view showing output characteristics of the magnetic sensor.

Hereafter the magnetic sensor 50 repeatedly takes the sensor positions [1] to [4] with respect to the S and N poles of the magnetic field generating magnet 55. FIG. 15B shows output waveforms of the magnetic sensor 50.

Figure 16A:
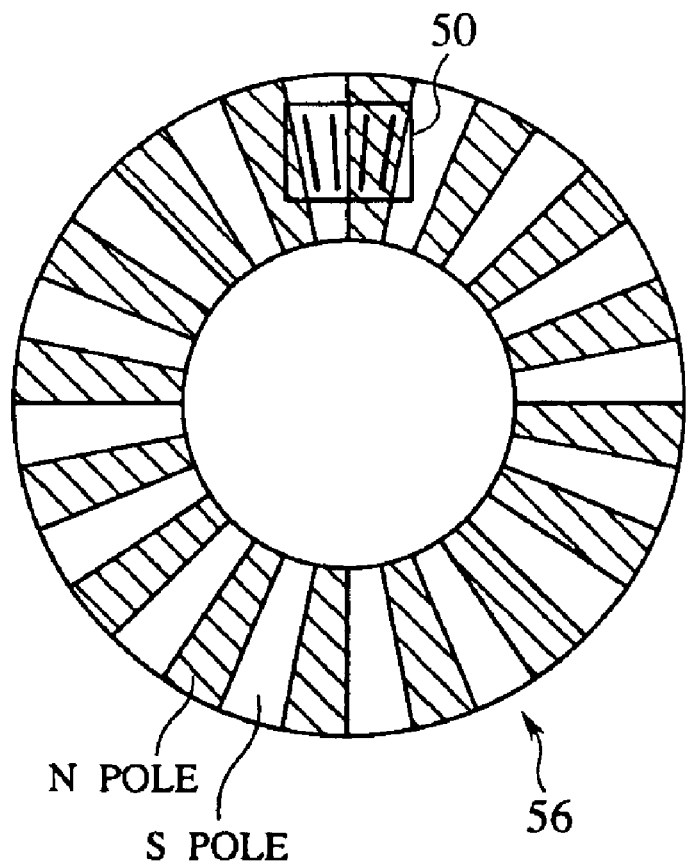
FIG. 16A is a view of an actual magnetic encoder.
Figure 16B:
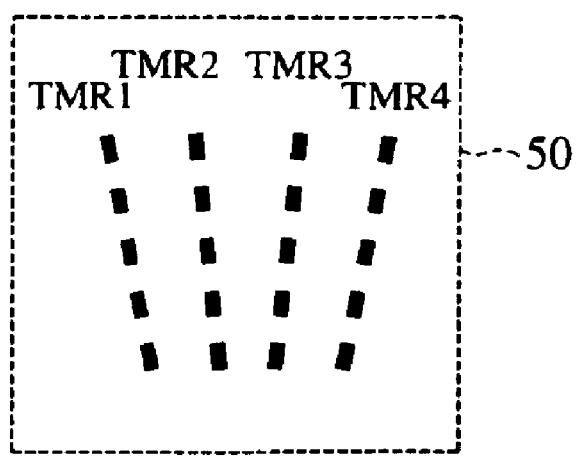
FIG. 16B is an enlarged view of a magnetic sensor of the magnetic encoder.

FIG. 16 is views of an actual magnetic encoder using the operational principle explained with reference to FIG. 14. This magnetic encoder includes a rotary magnetic body 56 and a magnetic sensor 50 disposed near the rotary magnetic body 56. Actually the rotary magnetic body 56 is used in place of making the magnetic field generating magnet 55 infinitely elongate.

The rotary magnetic body 56 has a 10 mm-diameter, and the shaft has a 5 mm-diameter. Sixteen pairs of S pole and N pole are arranged radially on the circumferential surface. A magnetic period λ is about 1.5 mm. The magnetic sensor 50 is positioned with the center of the sensor aligned with the center of the radial magnetic portions of the rotary magnetic body 56.

In the magnetic sensor 50 respective ferromagnetic tunnel junction elements TMR must be arranged at λ/4 gap with respect to each other and in parallelism with radially extended magnets of the rotary magnetic body. To this end, the respective TMR elements form an about 5.6° and spaced at the center from each other by a 0.37 mm gap. The thus-formed magnetic encoder can provide by the respective ferromagnetic tunnel junction elements TMR of the magnetic sensor 50 the output waveforms explained with reference to FIG. 15B. That is, when the magnetic sensor 50 is displaced by a magnetic period λ with respect to the rotary magnetic body 56, an output pulse of one period is generated.

As described in connection with the spin valve magnetic sensor, the sensor portion can be formed at a proximal location in the magnetic layer regions of the tunnel junctions of the respective ferromagnetic tunnel junction elements TMR. Consequently, in the free-side magnetic layer, magnetic directions can easily rotate in respective magnetic domains of the free-side magnetic layer, free from the influence of the edges of the magnetic layer.

As described above, according to the present embodiment, innovational magnetic sensors, magnetic heads and magnetic encoders can be provided.

According to the present embodiment, rotation of magnetic directions of the free-side magnetic layer can be sufficiently ensured. The present invention is applicable generally to magnetic sensors, such as magnetic heads, magnetic encoders, etc.

(A Second Embodiment)

The magnetic head according to a second embodiment of the present invention will be explained with reference to FIG. 17. FIG. 17 is a sectional view of the magnetic head according tot he present embodiment. FIGS. 17B is an enlarged sectional view of the ferromagnetic tunnel junction element of the magnetic head shown in FIG. 17B.

Figure 17A:
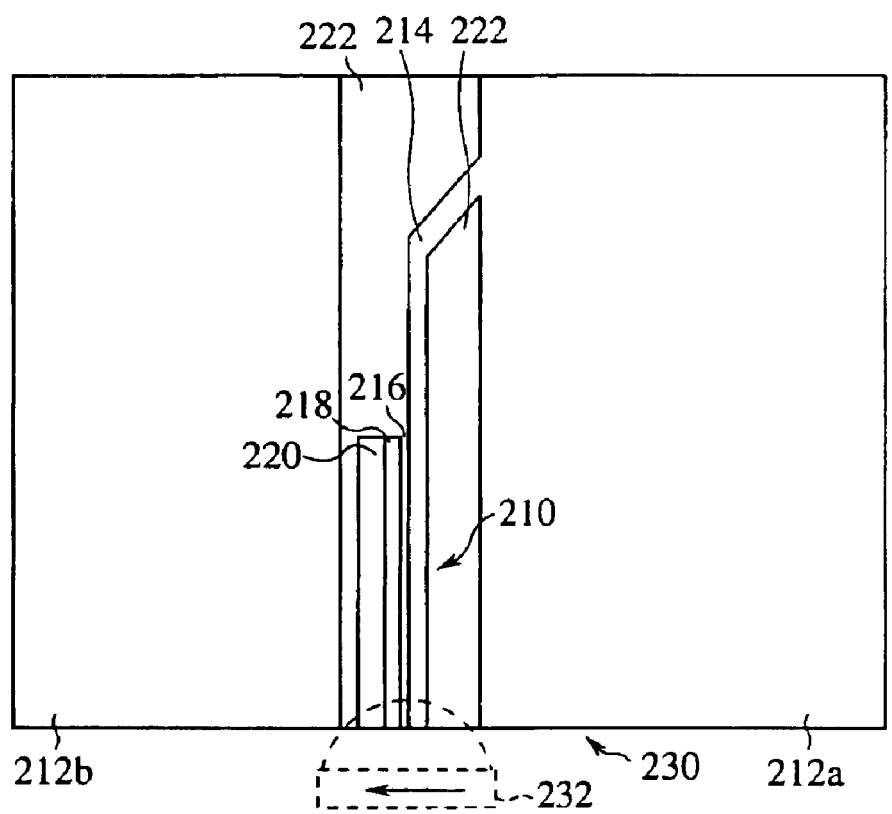
FIG. 17 is sectional views of the magnetic head according to a second embodiment of the present invention.
Figure 17B:
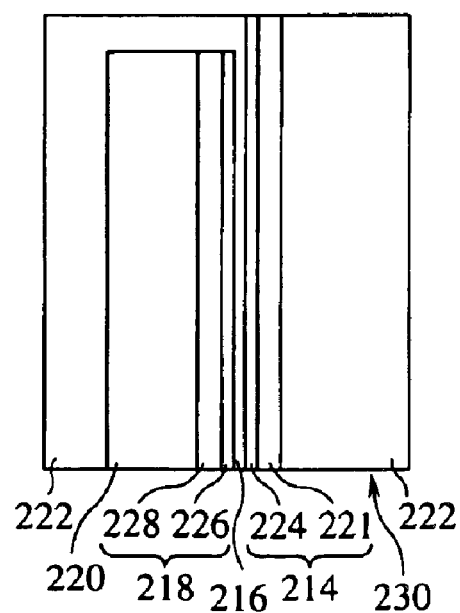

As shown in FIG. 17A, the magnetic head according to the present embodiment includes a ferromagnetic tunnel junction element 210 whose electric resistance changes corresponding to changes of a magnetic filed from the outside. The ferromagnetic tunnel junction element 210 includes a free layer 214, a barrier layer 216, a fixed layer 218 and an antiferromagnetic layer 220.

As shown in FIG. 17B, the free layer 214 is formed of a 3 nm-thickness NiFe layer 221 and a 3 nm-thickness Co layer 224. The barrier layer 216 is formed of a 1 nm-thickness $Al_2O_3$ layer adjacent to the Co layer 224 of the free layer 214.

The fixed layer 218 is formed of a 3 nm-thickness Co layer 226 and a 3 nm-thickness NiFe layer 228 adjacent to the barrier layer 216. The ferromagnetic layer 220 is formed of an NiO layer adjacent to the fixed layer 218.

Shield layers 212a, 212b of an NiFe layer are formed, spaced from the ferromagnetic tunnel junction element 210. A non-magnetic layer 222 of an $Al_2O_3$ layer is formed between the ferromagnetic tunnel junction element 210, and the shield layers 212a, 212b. The lower side as viewed in the drawing is a signal detection surface 230 of the magnetic head.

In the ferromagnetic tunnel junction element 210 having such structure, when a voltage is applied between the fixed layer 218 and the fee layer 214, current flows through the barrier layer 216.

FIG. 17A shows a state that a record bit 232 of a magnetic storage medium is near the ferromagnetic tunnel junction element 210. Actually a number of record bits are formed in a magnetic storage medium but are omitted in FIG. 17A.

When the record bit 232 of a magnetic storage medium comes near the ferromagnetic tunnel junction element 210, a magnetic direction of the free layer 214 rotates. On the other hand, the fixed layer 218, adjacent to which the antiferromagnetic layer 220 is formed, has a magnetic direction fixed.

The magnetic head according to the present embodiment is characterized in that, as shown in FIG. 17A, the free layer 214 is extended away from the signal detection surface 230 and has the end thereof connected to the shield layer 212a, which allows a magnetic flux from the record bit 232 to easily pass through the free layer 214.

In the present embodiment, because the free layer 214 is connected to the shield layer 212a of an NiFe layer, whose permeability is high, a magnetic flux from the record bit 232 easily pass through the free layer 214. In addition, because the free layer 214 is extended away from the signal detection surface 230, the influence of a demagnetizing field in the free layer 214 can be reduced. Thus, a rotation angle of a magnetic direction of the free layer 214 can be large. The free layer 214 is connected smoothly to the shield layer 212a in a region spaced form the signal detection surface 230, which reduces the influence of the demagnetizing field in the free layer 214.

Figure 18:
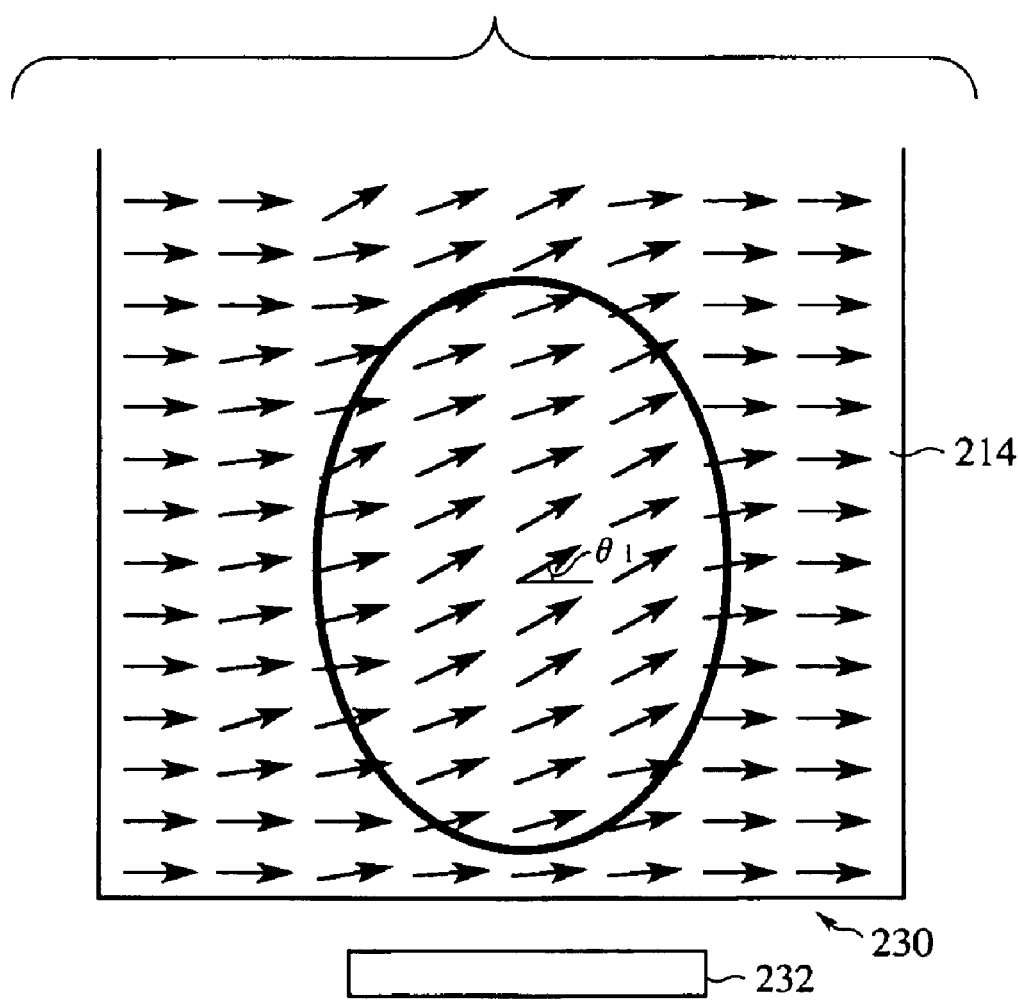
FIG. 18 is a schematic view of magnetic directions of the free layer at the time when a record bit comes near.

The change of a magnetic direction of the free layer 214 of the magnetic head according to the present embodiment will be explained with reference to FIG. 18. FIG. 18 is a schematic view of magnetic directions of the free layers at the time when a record bit comes near. The arrows indicate magnetic directions. The region surrounded by the ellipse is a region where magnetization angles of the free layer is above a certain angle. FIG. 18 shows magnetic directions of the free layer in a area which is about 20 μm away from the signal detection surface.

Figure 6:
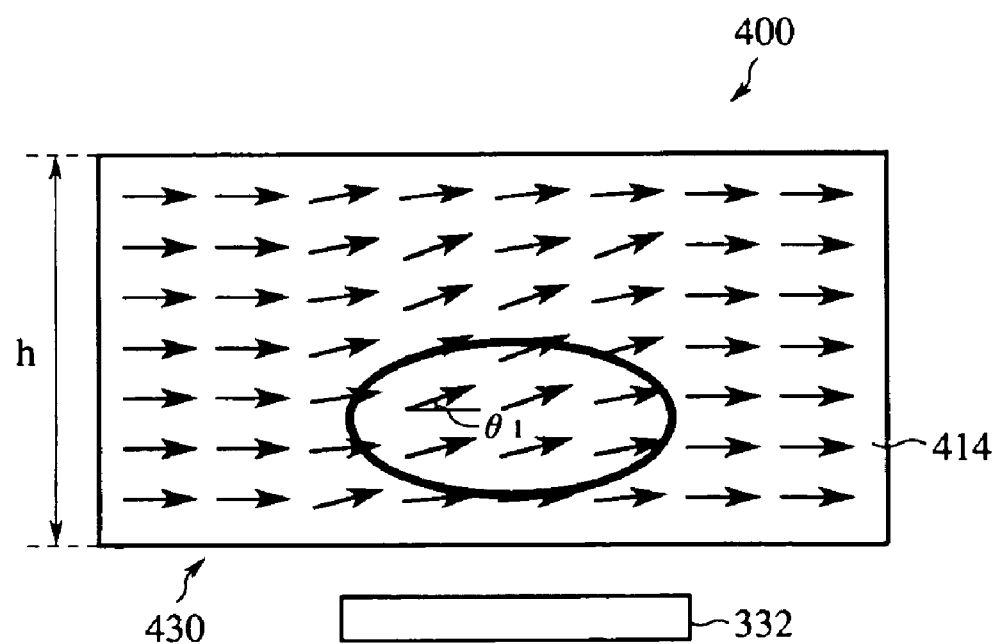
FIG. 6 is a schematic view of magnetic directions of the free layer at the time when a recording bit comes near.

In the magnetic head using a spin valve structure, as the core is micronized, as shown in FIG. 6 the influence of demagnetizing field takes place near the signal detection surface 430 and the upper part of the core 400. Accordingly, a magnetic angle $\theta_1$ of the free layer 414 is small when the record bit 232 comes near, which makes it impossible to obtain high outputs.

In contrast to this, in the present embodiment, the free layer 214 is extended away from the signal detection surface 230, whereby the influence of the demagnetizing field does not easily take place near the region of the junction between the fixed layer 218 and the free layer 214. Accordingly, as shown in FIG. 18, changes of a magnetic direction of the free layer 214 at the time when the record bit 232 comes near take place even in the region away from the signal detection surface 230, and, in addition, magnetic angles $\theta_1$ can be large.

Accordingly, in the present embodiment, large electric resistance changes, is comparison with those of the conventional magnetic head, can be obtained when the record bit 232 comes near the ferromagnetic tunnel junction element 210, whereby higher detection sensitivity can be provided.

As described above, in the present embodiment, the free layer is extended away from the signal detection surface, and the end of the extended free layer is connected to the shield layer of high permeability, whereby the influence of the demagnetizing field in the free layer can be reduced. Consequently, the influence of the demagnetizing field near the region of junction between the free layer and the fixed layer can be reduced, whereby a rotation angle of a magnetic direction in the junction region can be large, and an electric resistance change at the time when a record bit comes near can be large. Consequently, even in a case that the junction region has a small width, the magnetic head can have sufficiently high detection sensitivity, and is adaptable to higher record densities of magnetic storage mediums.

OTHER EXAMPLES (EXAMPLE 1)

Figure 19A:
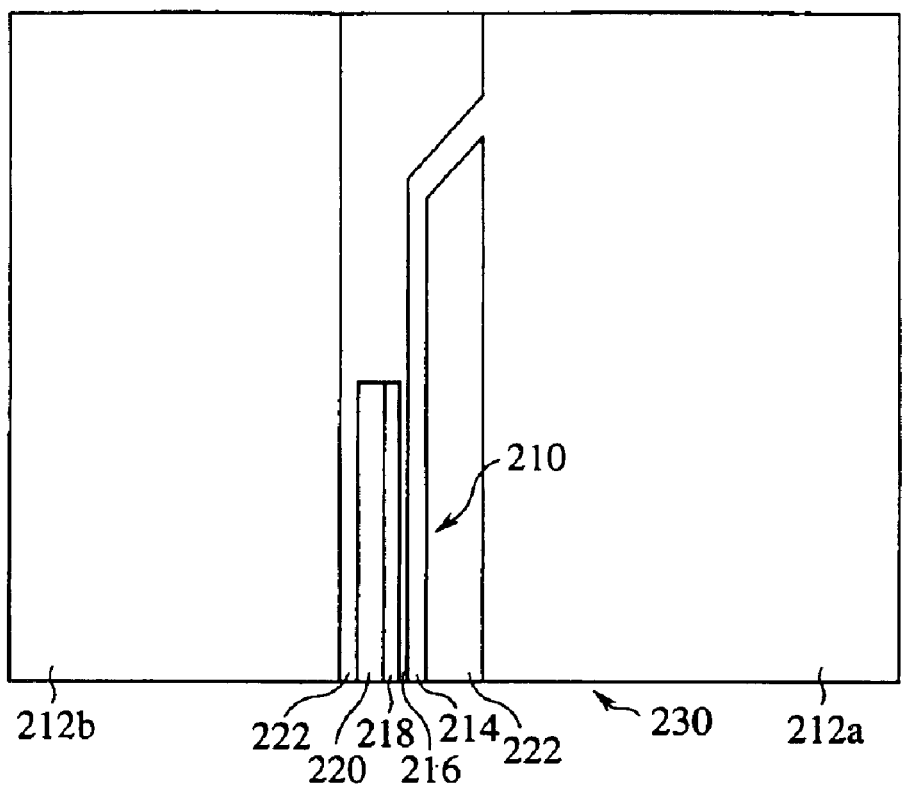
FIG. 19 is a sectional view of an example of the magnetic head according to the second embodiment of the present invention (Example 1).
Figure 19B:
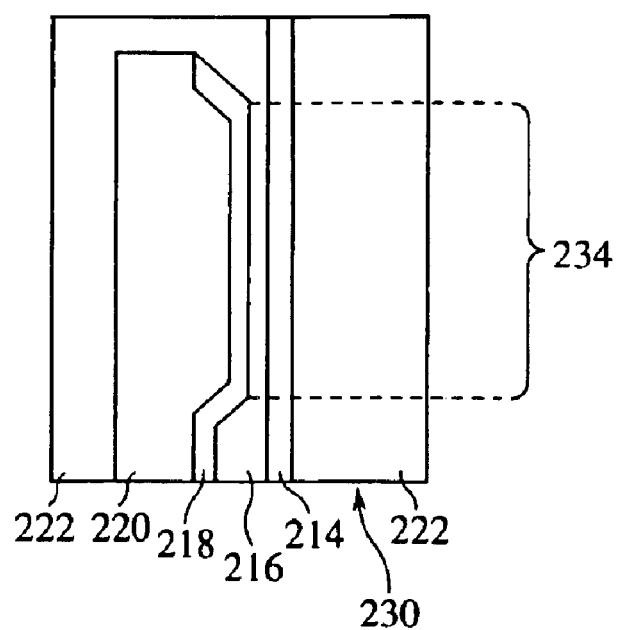

One example (Example 1) of the magnetic head according to the second embodiment of the present invention will be explained with reference to FIG. 19. FIG. 19 is sectional views of the magnetic head according to the present example. FIG. 19B is an enlarged sectional view of the ferromagnetic tunnel junction element shown in FIG. 19A.

As shown in FIG. 19, in the present example, a region where the influence of the demagnetizing field is little is the region 234 of junction between a fixed layer 218 and a free layer 214.

That is, in the edge part of the fixed layer 218 rotation angles of magnetic directions small due to the influence of the demagnetizing field taking place there. In the present example, however, the barrier layer 216 is thin in a region near the central part of the fixed layer 218 to an extent that the tunnel junction is possible and is thick in a region near the edge part of the fixed layer 218. Accordingly, the region of the fixed layer 218 except the edge part thereof, i.e., a region where the influence of the demagnetizing field is little is the junction region 234, whereby electric resistance changes of a ferromagnetic tunnel junction elements 210 due to magnetic fields from record bits can be large.

As described above, according to the present example, a region where the influence of demagnetizing fields is little is the junction region, whereby magnetic heads having high detection sensitivities can ben provided.

OTHER EXAMPLES (EXAMPLE 2)

Figure 20:
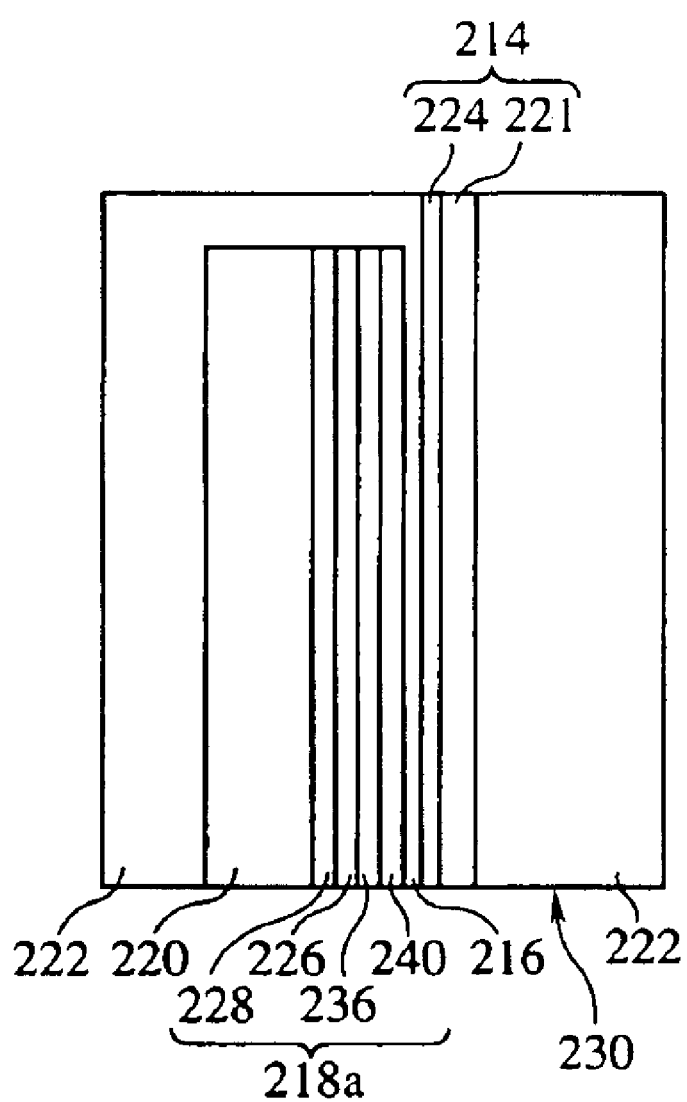
FIG. 20 is a sectional view of another example of the magnetic head according to the second embodiment of the present invention (Example 2).

Another example (Example 2) of the magnetic head according to the second embodiment of the present invention will be explained with reference to FIG. 20. FIG. 20 is a sectional view of the magnetic head according to the present example.

As shown in FIG. 20, the present example is the same as the magnetic head according to the second embodiment shown in FIG. 17 in that in the former, a fixed layer 218a is formed of a 2 nm-thickness NiFe layer 228, a 2 nm-thickness Co layer 226, a 1 nm-thickness Ru layer 236 and a 3 nm-thickness Co layer 240.

In the present example, the fixed layer 218a is formed of the layer film of the NIFe layer 228, the Co layer 226, the Ru layer 236 and the Co layer 240, and antiferromagnetic coupling is formed between the Co layer 226 and the Co layer 240, whereby extension of a magnetic filed from the fixed layer 218a to the free layer 214 can be suppressed. Accordingly, shift of a bias point of the free layer can be prevented.

OTHER EXAMPLES (EXAMPLE 3)

Figure 21A:
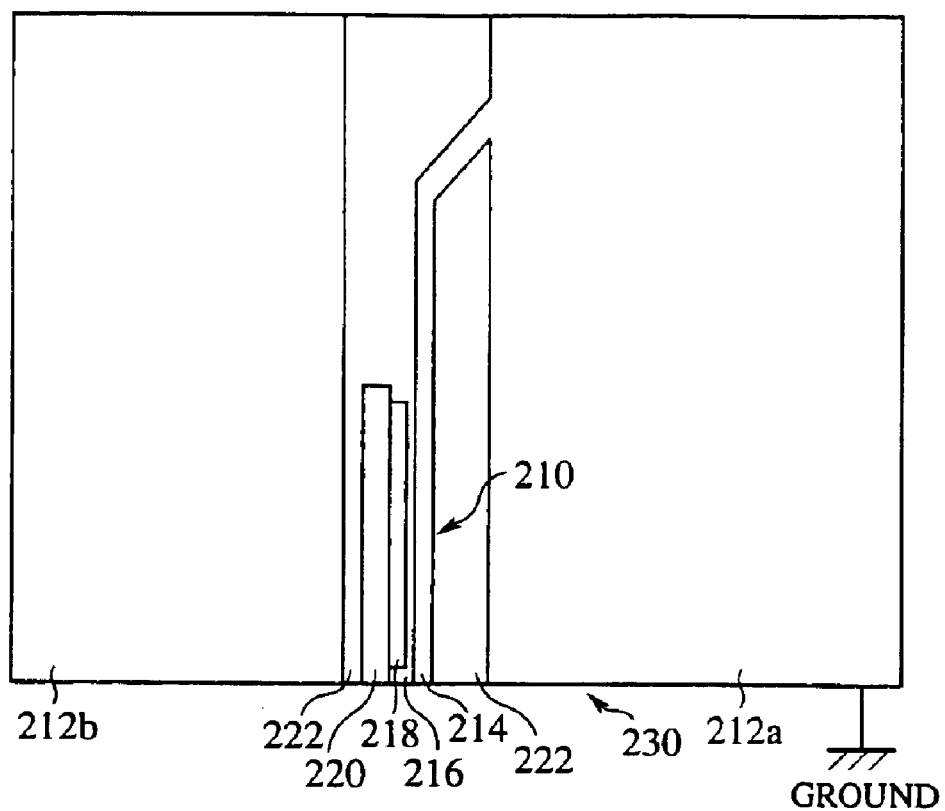
FIG. 21 is sectional views of further another example of the magnetic head according to the second embodiment of the present invention (Example 3).
Figure 21B:
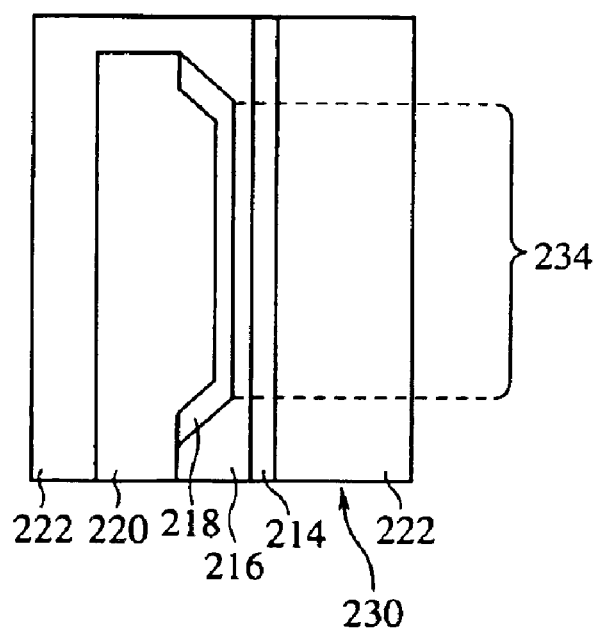

Further another example (Example 3) of the magnetic head according to the second embodiment of the present invention will be explained with reference to FIG. 21. FIG. 21 is sectional views of the magnetic head according to the present example. FIG. 21B is an enlarged sectional view of the ferromagnetic tunnel junction element shown in FIG. 21A.

As shown in FIG. 21A, the magnetic head according to the present example is characterized in that a fixed layer 218 is not exposed to a signal detection surface 230, and a shield layer 212a connected to the end of a free layer 214 is grounded.

In the present example, because the fixed layer 218 is not exposed to the signal detection surface 230, even when a potential difference takes place between the fixed layer 218 and the magnetic record medium (not shown), occurrence of discharge can be prevented.

In the present example, the free layer 214 exposed to the signal detection surface 230 is grounded via the shield layer 212a. Accordingly, a magnetic record medium is grounded, whereby no potential difference takes place between the free layer 214 and a magnetic record medium. Accordingly, occurrence of potential difference between the free layer 214 and a magnetic record medium can be prevented, whereby occurrence of discharge from the free layer 214 to the magnetic medium can be prevented. According to the present example, breakage of stored information of record bits due to discharge can be prevented.

In the present example, a junction region 234 between the fixed layer 218 and the free layer 214 is spaced from the signal detection surface 230. Accordingly, even when the signal detection surface 230 is abraded, it is rare that even the junction region 234 between the fixed layer 218, and the free layer 214 is abraded. Thus, decrease of the junction region 234 between the fixed layer 218 and the free layer 214 can be prevented.

Accordingly, the magnetic head according to the present example is applicable as a contact-type magnetic head which is used in contact with the signal detection surface 230 with a magnetic record medium.

As described above, according to the present example, the fixed layer is not exposed to the signal detection surface, whereby even when a potential difference takes place between the fixed layer and a magnetic record medium takes place, occurrence of discharge can be prevented. The free layer exposed to the signal detection surface is grounded via the shield layer, whereby a magnetic record medium is grounded to thereby make a potential of the free layer and that of a magnetic record medium equal to each other. Accordingly, occurrence of potential difference between the free layer and a magnetic record medium can be prevented, and discharge from the free layer to the magnetic record medium can be prevented, whereby breakage of stored information of record bits of a magnetic record mediums can be prevented.

In the present example, the junction region between the fixed layer and the free layer is spaced from the signal detection surface, whereby even when the signal detection surface is abraded, it is rare that even the junction region between the fixed layer and the free layer is abraded. Accordingly, decrease of the junction region between the fixed layer and the free layer can be prevented. Thus, the present example is applicable to contact-type magnetic heads which is used with the signal detection surface in contact with a magnetic record medium.

(A Third Embodiment)

Figure 22:
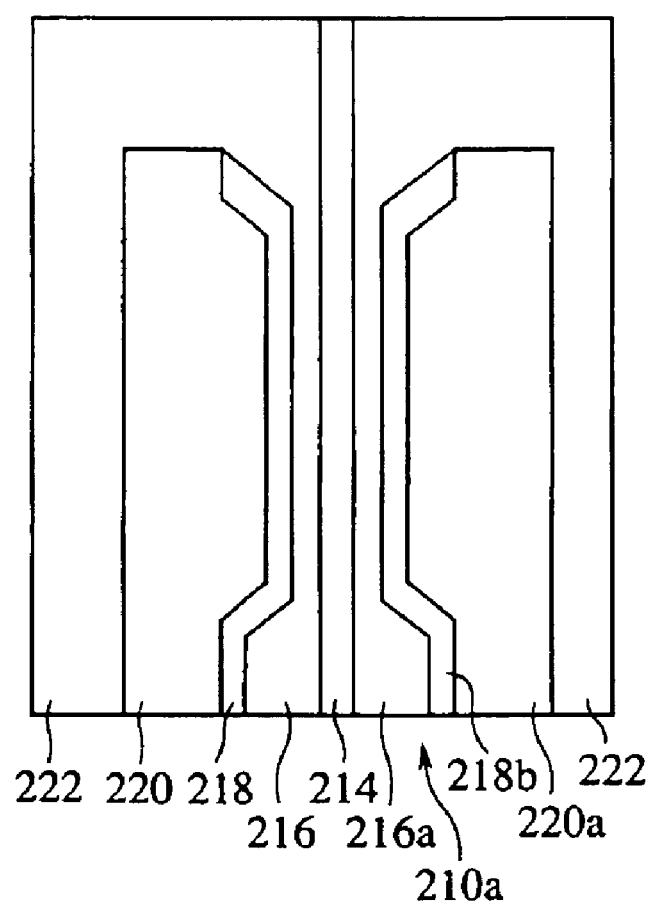
FIG. 22 is a sectional view of the magnetic head according to a third embodiment of the present invention.

The magnetic head according to a third embodiment of the present invention will be explained with reference to FIG. 22. FIG. 22 is a sectional view of the magnetic head according to the present embodiment. The same members of the magnetic head according to the present embodiment as those of the magnetic head according to the second embodiment shown in FIGS. 17A to 21 are represented by the same reference numbers not to repeat or to simplify the explanation.

As shown in FIG. 22, the magnetic head according to the present embodiment is characterized in that a ferromagnetic tunnel junction element 210a includes to ferromagnetic tunnel junctions.

That is, a barrier layer 216a which is substantially the same as the barrier layer 216 are formed plane-symmetrical with respect to the free layer 214. A fixed layer 218b which is substantially the same as the fixed layer 218 are formed plane-symmetrical with respect to the free layer 214. A antiferromagnetic layer 220a which is substantially the same as the antiferromagnetic layer 220 are formed plane-symmetrical with respect to the free layer 214.

When a record bit (not shown) comes near a ferromagnetic tunnel junction element 210a, a magnetic direction of the fixed layer 218 becomes the same as that of the fixed layer 218b.

The ferromagnetic tunnel junction 210a has tow ferromagnetic tunnel junctions, outputs of the two ferromagnetic tunnel junctions are combined to thereby realize high detection sensitivity.

A difference between outputs of the two ferromagnetic tunnel junctions of the ferromagnetic tunnel junction element 210a is detected to thereby cancel noises of the same phase.

As described above, according to the present embodiment, two ferromagnetic tunnel junctions are formed plane-symmetrical with respect to the free layer, whereby outputs of the two ferromagnetic tunnel junctions are combined to thereby realize high-output sensitivity. A difference between outputs of the two ferromagnetic tunnel junctions is detected to thereby cancel noises of the same phase.

(A Fourth Embodiment)

Figure 23:
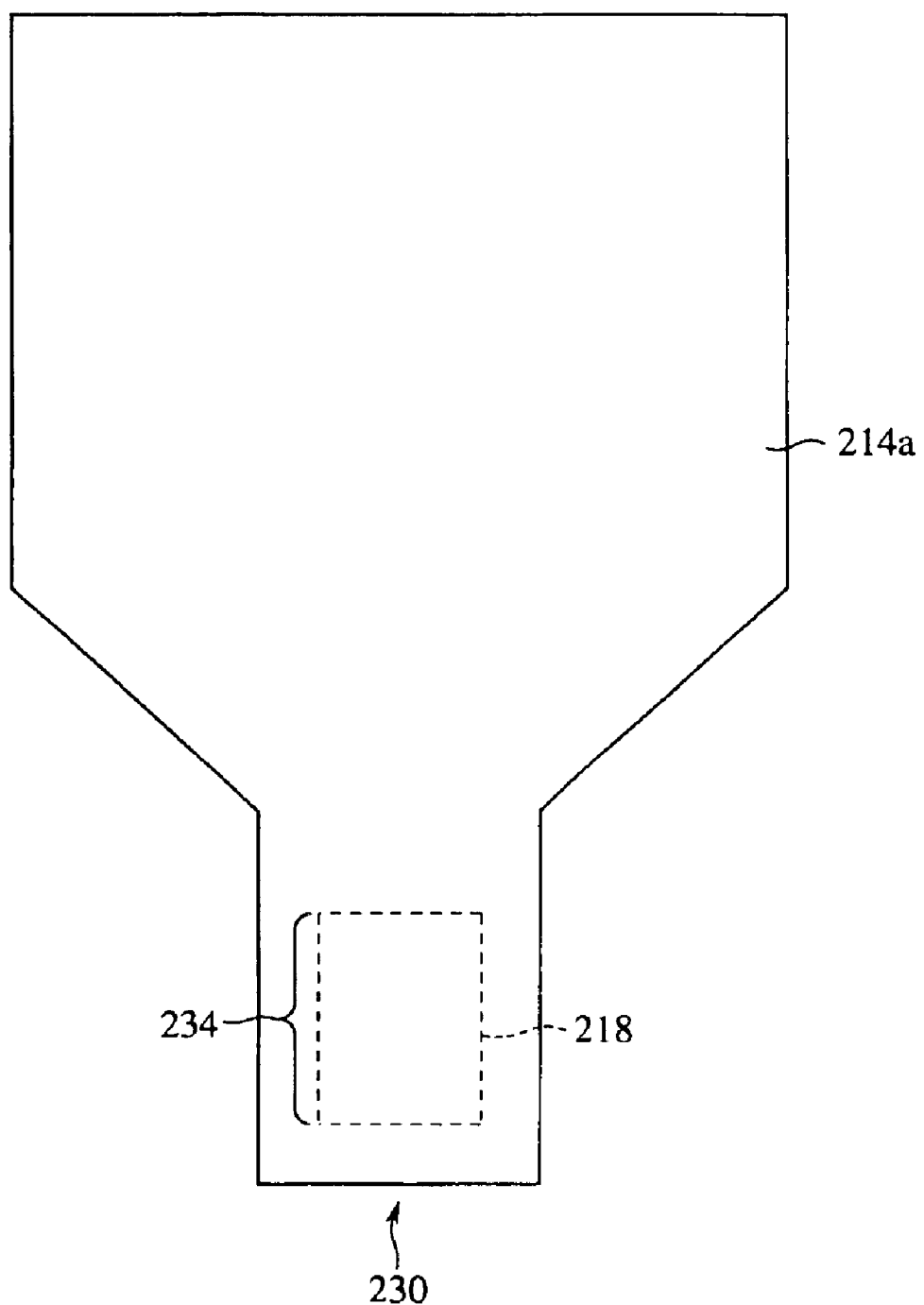
FIG. 23 is a side view of the magnetic head according to a fourth embodiment of the present invention.

The magnetic head according to a fourth embodiment of the present invention will be explained with reference to FIG. 23. FIG. 23 is a side view of the magnetic head according to the present embodiment. The same members of the magnetic head according to the present embodiment as those of the magnetic head according to the second or the third embodiment shown in FIGS. 17 to 22 are represented by the same reference numbers not to repeat or to simplify the explanation.

As shown in FIG. 23, the magnetic head according to the present embodiment is characterized by the shape of a free layer 214a. That is, the free layer 214a has a width which is a little larger than a width of a fixed layer 218, near a signal detection surface 230 and a junction region 234 between the fixed layer 218 and the free layer 214a, has the width gradually increased away from the signal detection surface 230, and has a much increased width at a part which is further away from the signal detection surface 230.

In the free layer which is simply formed in a rectangular shape, even when no external magnetic field is applied, a magnetic direction of the free layer is tilted in the longitudinal direction of the free layer. In the present embodiment, however, because the free layer is formed in the shape as shown in FIG. 23, a magnetic direction of the free layer 214a near the junction region 234 is prevented from tilting when no external magnetic field is applied. Accordingly, when an external magnetic field is applied, a magnetic direction of the free layer 214a sufficiently rotate near the junction region 234, whereby the magnetic head can have high detection sensitivity.

As described above, according to the present embodiment, the free layer is wider away from the signal detection surface and is further wider in a region which is away from the signal detection surface, whereby when no external magnetic field is applied, a magnetic direction of the free layer is prevented from tilting near the junction region. Accordingly a rotation angle of a magnetic direction of the free layer near the junction region can be large, and the magnetic head can have high detection sensitivity.

(A Fifth Embodiment)

Figure 24:
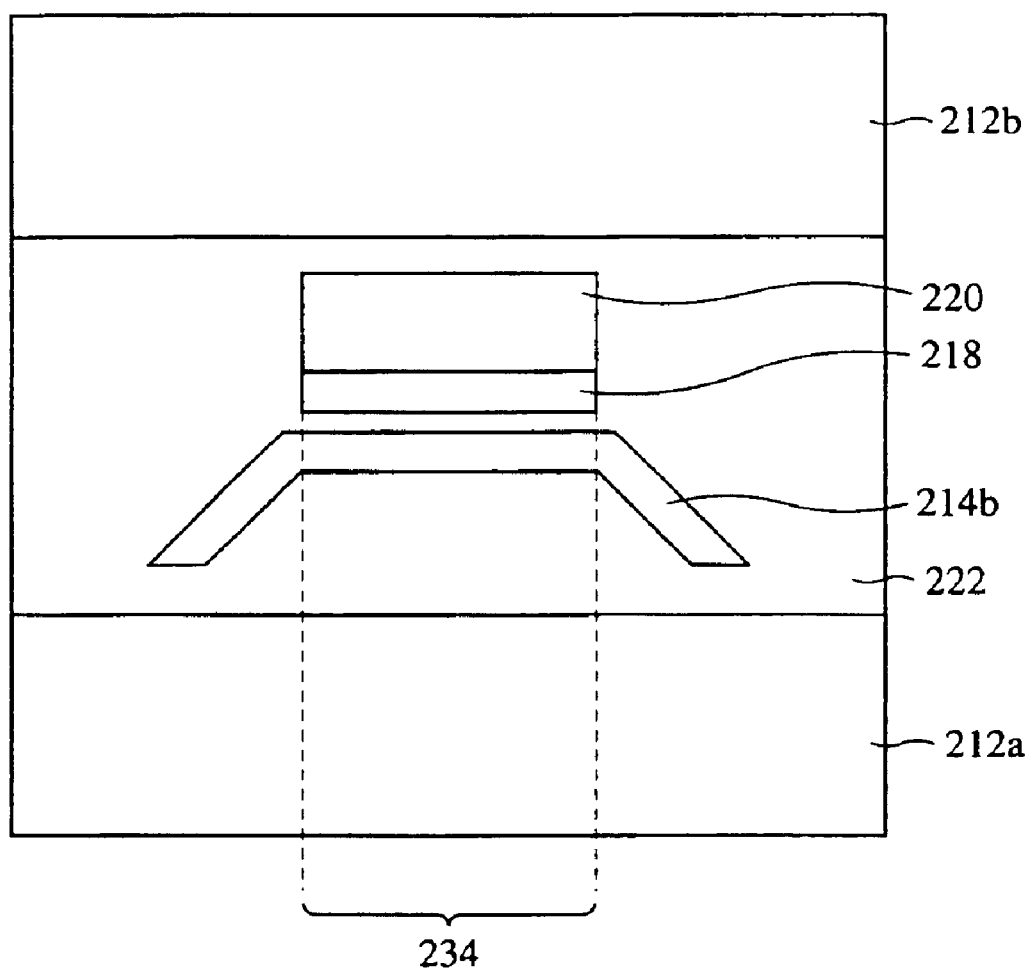
FIG. 24 is a plan view of the magnetic head according to a fifth embodiment of the present invention.

A magnetic head according to a fifth embodiment of the present invention will be explained with reference to FIG. 24. FIG. 24 is a plan view of the magnetic head according to the present embodiment as viewed at the side of the signal detection surface. The same members of the magnetic head according to the present embodiment as those of the magnetic head according to the second to the fourth embodiment shown in FIGS. 17A to 23 are represented by the same reference numbers not to repeat or to simply the explanation.

As shown in FIG. 24, the magnetic head according to the present embodiment is characterized in that a free layer 214b in the region except a junction region 234 between a fixed layer 218 and a free layer 214b is bent to be away from the fixed layer 218.

Because the free layer 214b in the region except the junction region 234 between the fixed layer 218 and the free layer 214b is bent away from the fixed layer 218, even a distance of tracks is small due to high recording density of a magnetic record medium, a magnetic filed from record bits of adjacent tracks is less influential.

As described above, according to the present embodiment, the free layer in the region except the junction region between the fixed layer and the free layer is bent away from the fixed layer, magnetic fields from record bits of adjacent tracks can be made less influential. Thus, magnetic fields from record bits of adjacent tracks can be made less influential, which makes the magnetic head applicable to high recording densities of magnetic storage mediums.

Other Examples

Figure 25:
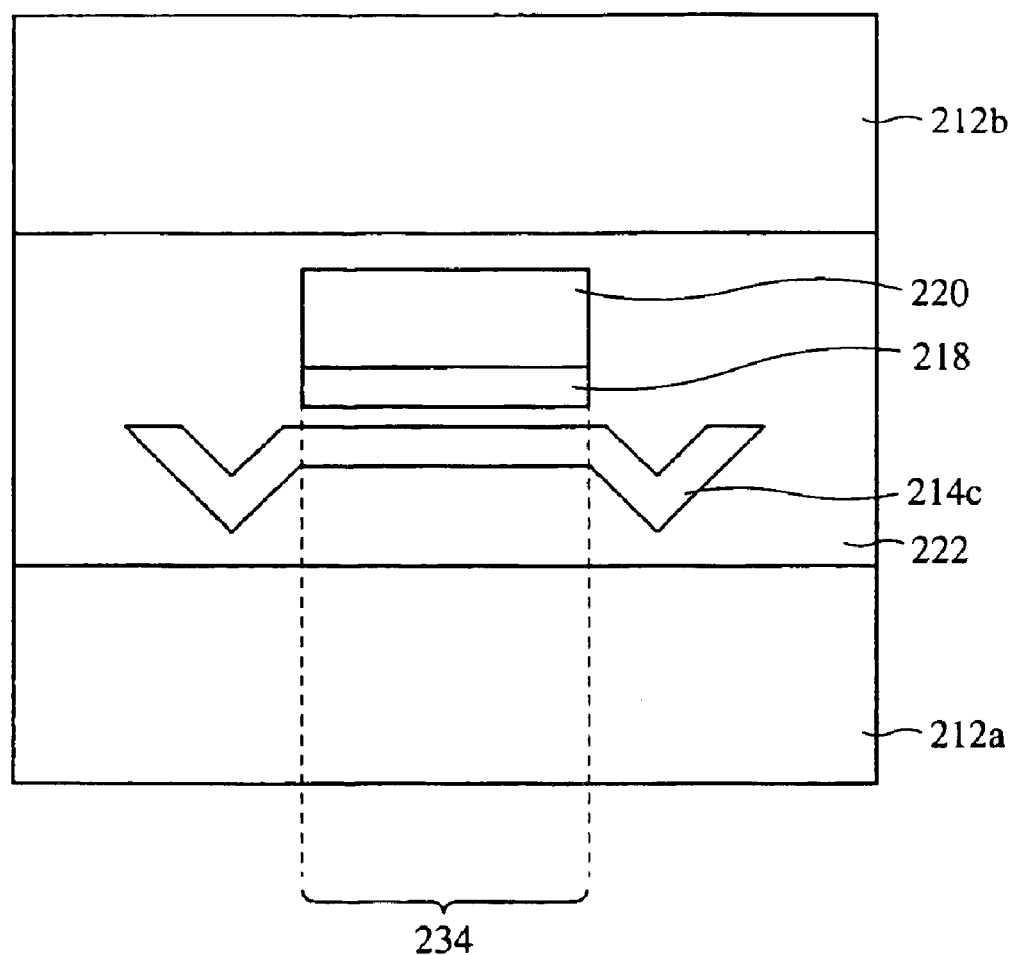
FIG. 25 is a plan view of an example of the magnetic head according to the fifth embodiment of the present invention.

One example of the magnetic head according to the fifth embodiment of the present invention will be explained with reference to FIG. 25. FIG. 25 is a plan view of the magnetic head according to the present example as viewed at the side of the signal detection surface.

As shown in FIG. 25, in the present example, a free layer 214c in the region except a junction region 234 between a fixed layer 218 and the free layer 214c is bent away from the fixed layer 218, and furthermore the bent part of the free layer 214c is bent away from a shield layer 212a. Thus, a spacing between the shield layer 212a and a shield layer 212b can be small, whereby a portion for detecting signals can be micronized. The magnetic head is applicable to higher recording density of magnetic storage mediums.

(Modified Embodiments)

The present invention is not limited to the above-described embodiments and can cover various modifications.

For example, in the first embodiment it is possible that the lower layer 10 functioning the free layer is extended away from the signal detection surface, and the end of the extended lower layer 10 is connected to a shield layer of high permeability. Thus, the influence of the demagnetizing field in the sensor portion 13 can be further decreased, and higher detection sensitivity can be provided.

In the first embodiment it is possible that the lower layer 10 is formed as the free layer 214b shown in FIG. 24. That is, it is possible that the sensor portion 13 is bent away from the upper layer 12 in the region except the sensor portion 13. Thus, magnetic field from record bits of adjacent tracks can be made less influential, whereby the magnetic head is adaptable to thigh recording density of magnetic storage mediums.

A magnetic head using the magnetic sensor according to the first embodiment is applicable to hard disk devices. The magnetic sensor of such high sensitivity is used, which makes hard disk devices adaptable to high recording density of magnetic storage mediums.

In the second to the fifth embodiments, the free layer is connected to the shield layer, but the free layer may be connected not only to the shield layer, but also suitably to a magnetic body of high permeability.

In the second to the fifth embodiments, the magnetic heads have been explained, but hard disk devices using the above-described magnetic heads can be provided. A plurality of such hard disk devices are used to provide a disk array device.

In the first to the fifth embodiments the free layer and the fixed layer are formed of an NiFe layer and a Co layer. However, materials of the free layer and the fixed layer are not limited to NiFe layer and Co layer. The free layer and the fixed layer may be formed of other layers as long as they can realize the ferromagnetic tunnel junction.

INDUSTRIAL APPLICABILITY

The present invention is suitable for magnetic sensor, magnetic heads, magnetic encoders and hard disk devices, more specifically to magnetic sensors, magnetic heads, magnetic encoders which can realize good sensitivity, magnetic heads which are adaptable to high density of magnetic storage mediums of high density and hard disk devices of large storage capacities using the magnetic heads.

What is claimed is:

1. A magnetic sensor including a ferromagnetic tunnel junction, comprising:
    a free layer, a magnetic direction of which freely rotates; and
    a barrier layer formed on the free layer,
    the barrier layer including a first region and a second region around the first region, and a thickness of the barrier layer in the second region being greater than a thickness of the barrier layer in the first region, both of said first and second regions being on the free layer in a layer-stacking direction, a region of the free layer corresponding to the first region functioning as a sensor portion for sensing an external magnetic field.

2. A magnetic sensor according to claim 1, wherein the barrier layer is formed by oxidizing the surface of a metal.

3. A magnetic sensor according to claim 1 or 2, further comprising:
   a fixed layer formed on the barrier layer; and
   a antiferromagnetic layer formed on the fixed layer and fixing a magnetic direction of the fixed layer.

4. A magnetic senor according to claim 3, wherein the free layer in a region where the fixed layer is not formed is bent away from the fixed layer.

5. A magnetic head comprising the magnetic sensor according to claim 1 or 2.

6. A magnetic encoder comprising the magnetic sensor according to claim 1 or 2.

7. A magnetic head, comprising:
   a ferromagnetic tunnel junction element including a free layer, a magnetic direction of which freely rotates, and a fixed layer which is opposed to one surface of the free layer through a barrier layer, a magnetic direction of the fixed layer being fixed by an antiferromagnetic layer which is adjacent thereto; and
   shield layers of high permeability formed at both sides of the ferromagnetic tunnel junction element, the shield layers being spaced from the ferromagnetic tunnel junction element, respectively,
   wherein the fixed layer extends in a first direction generally parallel to the antiferromagnetic layer, and
   wherein an end portion of the free layer extends and projects from the ferromagnetic tunnel junction element toward one of the shield layers in a second direction different from the first direction, the end portion of the free layer connecting to the one of the shield layers.

8. A magnetic head according to claim 7, wherein the free layer is connected to the member of high permeability in a region spaced from a signal detection surface.

9. A magnetic head according to claim 7 or 8, wherein the free layer is connected smoothly to the member of high permeability, neighboring the same.

10. A magnetic head according to claim 7 or 8, wherein the member of high permeability is a shield layer formed, spaced from the ferromagnetic tunnel junction element.

11. A magnetic head according to claim 7 or 8, wherein the thickness of the barrier layer near the edge of the fixed layer is larger than a thickness of the barrier layer near a central part of the fixed layer.

12. A magnetic head according to claim 7 or 8, wherein the free layer is formed wider in a region spaced from the signal detection surface.

13. A magnetic head according to claim 7 or 8, wherein the fixed layer is not exposed to the signal detection surface.

14. A magnetic head according to claim 7 or 8, wherein the member of high permeability is grounded.

15. A magnetic head according to claim 7 or 8, wherein the free layer in a region which is not opposed to the fixed layer is bent away from the fixed layer.

16. A magnetic head according to claim 7 or 8, wherein the ferromagnetic tunnel junction element further includes another fixed layer which is opposed to the free layer through another barrier layer formed on the other surface of the free layer, a magnetic direction of said another fixed layer being fixed by another antiferromagnetic layer which is adjacent thereto.

17. A hard disk device comprising the magnetic head according to claim 5.

18. A disk array device comprising a plurality of the hard disk devices according to claim 17.

19. A hard disk device comprising the magnetic head according to claim 7.

* * * * *